(12) United States Patent
D'Evelyn et al.

(10) Patent No.: US 11,661,670 B2
(45) Date of Patent: May 30, 2023

(54) HIGH QUALITY GROUP-III METAL NITRIDE SEED CRYSTAL AND METHOD OF MAKING

(71) Applicant: SLT Technologies, Inc, Los Angeles, CA (US)

(72) Inventors: Mark P. D'Evelyn, Vancouver, WA (US); Drew W. Cardwell, Camas, WA (US); Jonathan D. Cook, Santa Barbara, CA (US)

(73) Assignee: SLT Technologies, Inc, Los Angeles, CA (US)

( * ) Notice: Subject to any disclaimer, the term of this patent is extended or adjusted under 35 U.S.C. 154(b) by 216 days.

(21) Appl. No.: 17/133,002

(22) Filed: Dec. 23, 2020

(65) Prior Publication Data

US 2021/0222317 A1   Jul. 22, 2021

Related U.S. Application Data

(60) Provisional application No. 62/962,087, filed on Jan. 16, 2020.

(51) Int. Cl.
   *C30B 28/04* (2006.01)
   *C30B 7/10* (2006.01)
   *C30B 29/40* (2006.01)

(52) U.S. Cl.
   CPC .............. *C30B 7/105* (2013.01); *C30B 28/04* (2013.01); *C30B 29/406* (2013.01)

(58) Field of Classification Search
   CPC ....... C30B 7/105; C30B 28/04; C30B 29/406; Y10S 117/915
   See application file for complete search history.

(56) References Cited

U.S. PATENT DOCUMENTS

| | | | |
|---|---|---|---|
| 5,474,021 A | 12/1995 | Tsuno et al. | |
| 6,163,557 A | 12/2000 | Dunnrowicz et al. | |
| 7,527,742 B2 | 5/2009 | Tysoe et al. | |
| 7,964,477 B2 | 6/2011 | Fujiwara | |
| 8,039,412 B2 | 10/2011 | Park et al. | |
| 8,101,498 B2 | 1/2012 | Pinnington et al. | |
| 9,564,320 B2 | 2/2017 | D'Evelyn et al. | |
| 9,589,792 B2 | 3/2017 | Jiang et al. | |

(Continued)

FOREIGN PATENT DOCUMENTS

JP   5364368   * 12/2013

OTHER PUBLICATIONS

Darakchieva et al., Journal of Crystal Growth, 2008, 310(5), 959-965.

(Continued)

*Primary Examiner* — Robert M Kunemund
(74) *Attorney, Agent, or Firm* — Patterson & Sheridan, LLP

(57) ABSTRACT

High quality ammonothermal group III metal nitride crystals having a pattern of locally-approximately-linear arrays of threading dislocations, methods of manufacturing high quality ammonothermal group III metal nitride crystals, and methods of using such crystals are disclosed. The crystals are useful for seed bulk crystal growth and as substrates for light emitting diodes, laser diodes, transistors, photodetectors, solar cells, and for photoelectrochemical water splitting for hydrogen generation devices.

22 Claims, 15 Drawing Sheets

(56) References Cited

U.S. PATENT DOCUMENTS

| | | | |
|---|---|---|---|
| 9,650,723 | B1 | 5/2017 | D'Evelyn et al. |
| 9,834,859 | B2 | 12/2017 | Mori et al. |
| 10,094,017 | B2 | 10/2018 | Pocius et al. |
| 2002/0111044 | A1 | 8/2002 | Linthicum et al. |
| 2006/0032432 | A1* | 2/2006 | Tischler ................ C30B 29/36 117/94 |
| 2006/0255341 | A1 | 11/2006 | Pinnington et al. |
| 2013/0119401 | A1 | 5/2013 | D'Evelyn et al. |
| 2014/0147650 | A1 | 5/2014 | Jiang et al. |
| 2016/0148817 | A1* | 5/2016 | Yamamoto .......... H01L 33/0075 250/311 |
| 2021/0222317 | A1 | 7/2021 | D'Evelyn et al. |

OTHER PUBLICATIONS

S. K. Mathis, et al., Journal of Crystal Growth 231, 371 (2001).

"Semiconductor Wafer Bonding" by Q.-Y. Tong and U. Gosele.

C. Roder, et al. "Temperature dependence of the thermal expansion of GaN" in Physical Review B, vol. 72, article 085218 (2005).

Non-Final Office Action for U.S. Appl. No. 16/745,227 dated Nov. 10, 2021.

Cao et al., Microelectronics Reliability, 2003, 43(12), 1987-1991.

Schubert et al., Applied Physics Letters, 2007, 91 (23), 231114.

Tomiya et al., IEEE Journal of Selected Topics in Quantum Electronics, 2004, 10(6), 1277-1286.

Orita et al., IEEE International Reliability Physics Symposium Proceedings, 2009, 736-740.

Kaun et al., Applied Physics Express, 2011, 4(2), 024101.

Tapajna et al., Applied Physics Letters, 2011, 99(22), 223501-223503.

U.S. Appl. No. 16/745,227, filed Jan. 16, 2020.

Final Office Action for U.S. Appl. No. 16/745,227 dated Mar. 18, 2022.

International Search Report dated Apr. 19, 2021, Application No. PCT/US2020/066900.

* cited by examiner

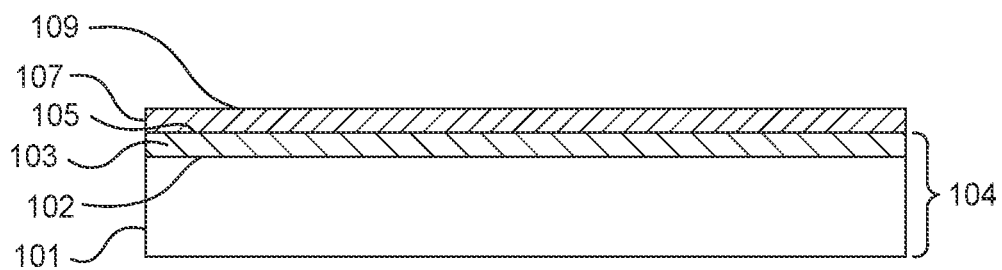
FIG. 1A
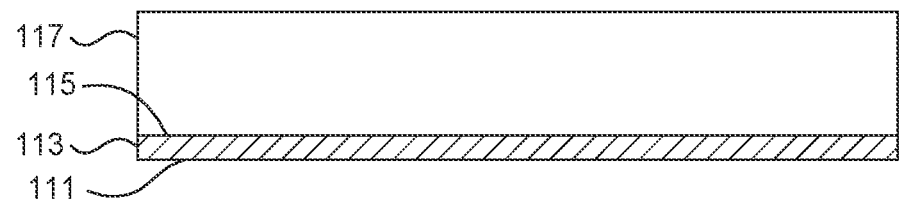
FIG. 1B
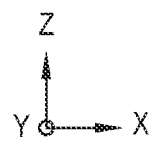

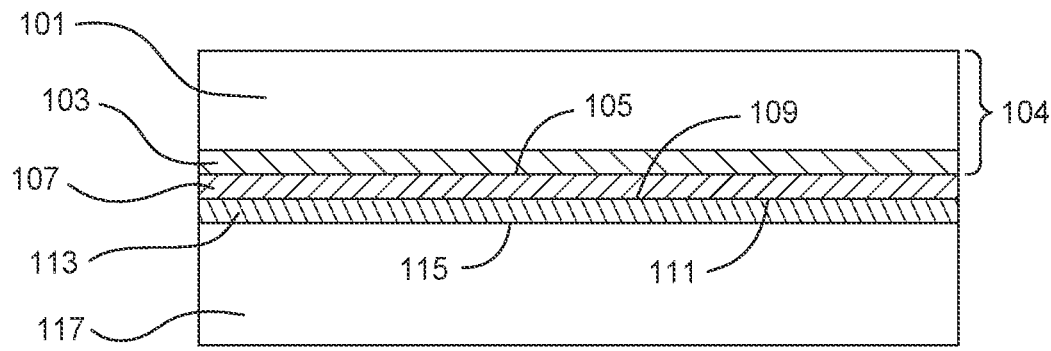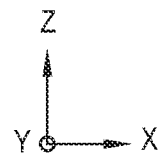
FIG. 3
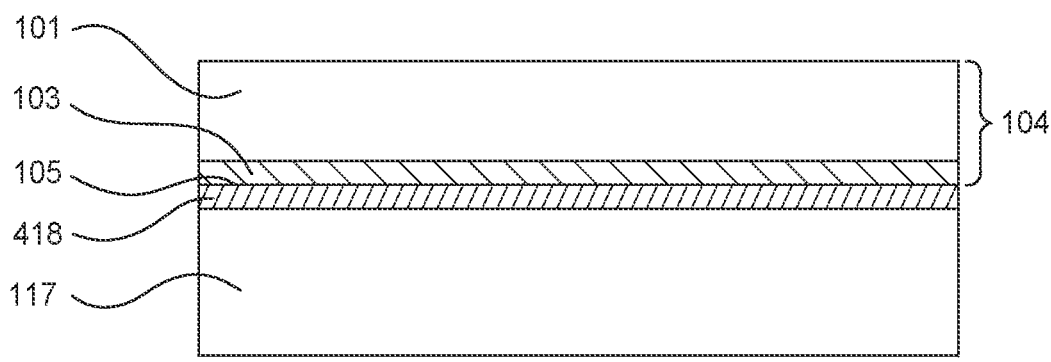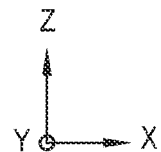
FIG. 4

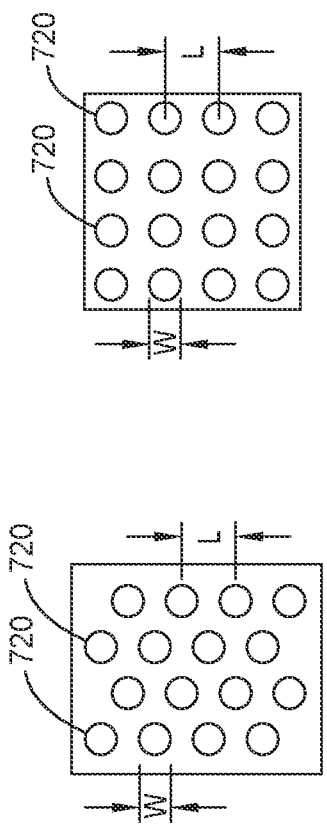
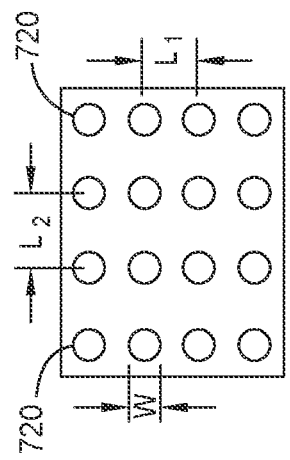
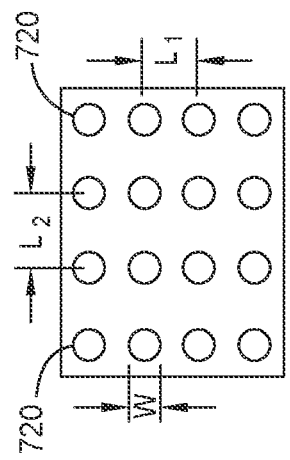
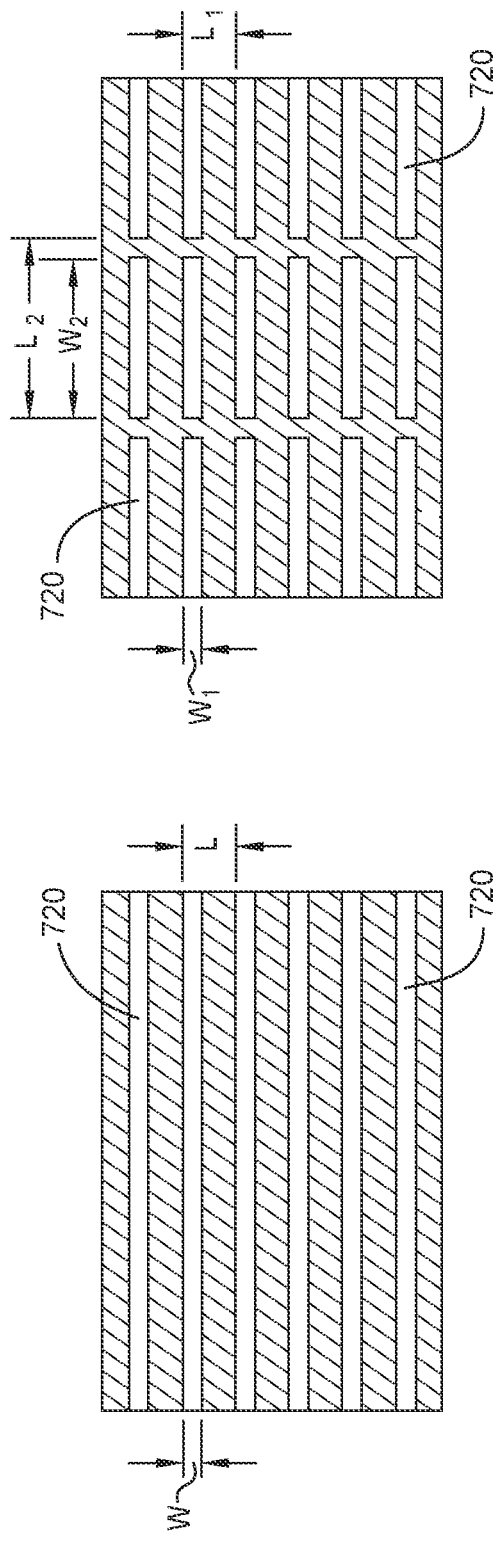
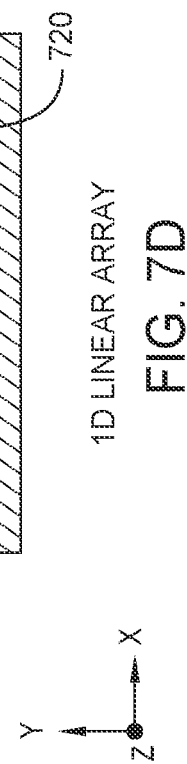

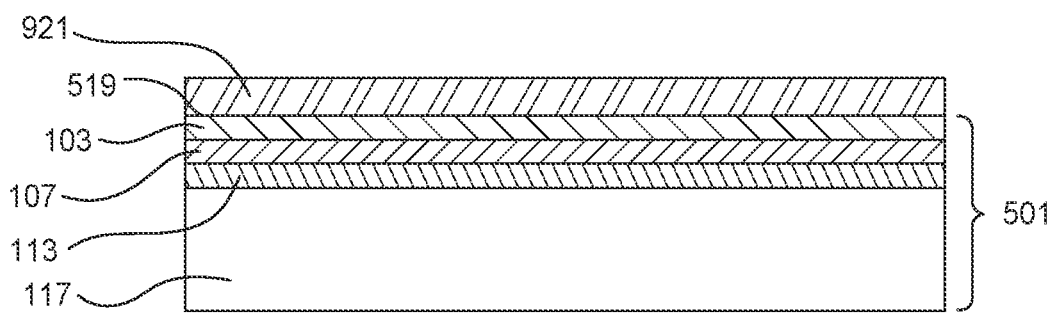
FIG. 9A
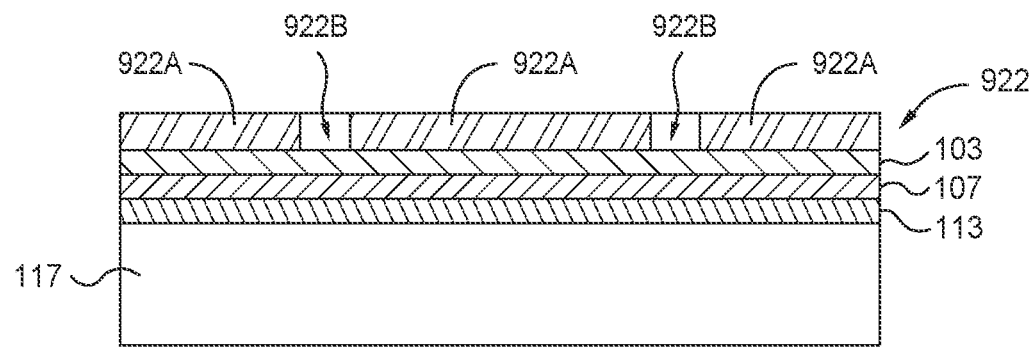
FIG. 9B
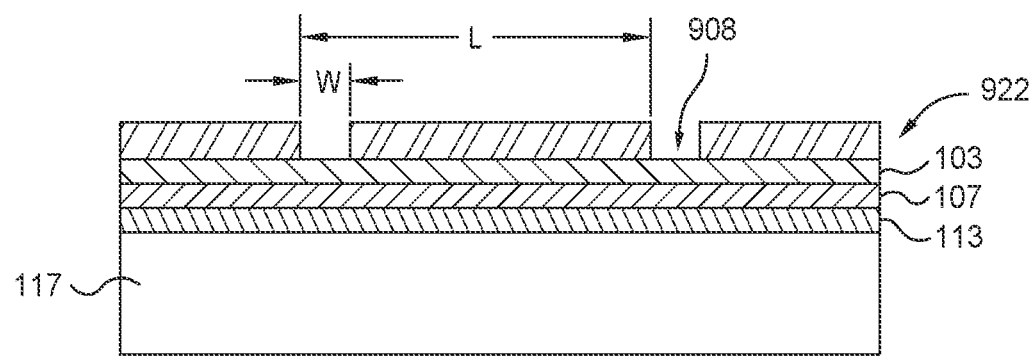
FIG. 9C
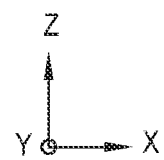

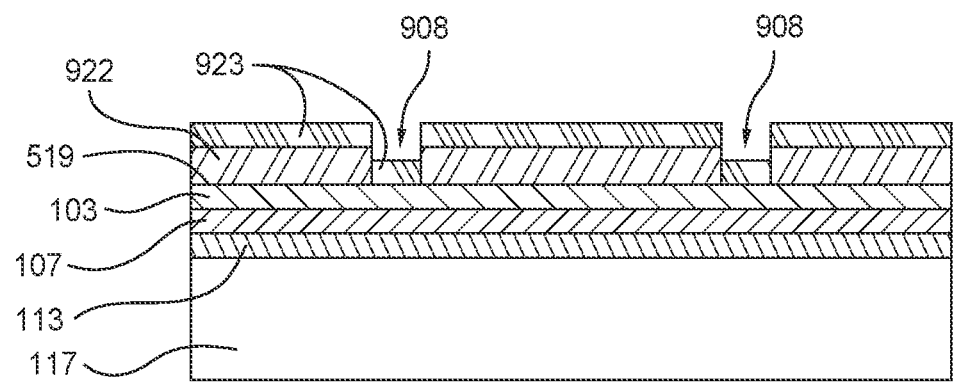
FIG. 9D
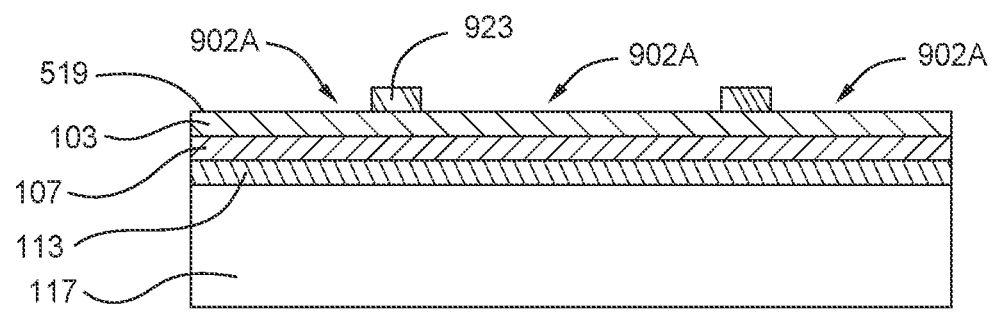
FIG. 9E
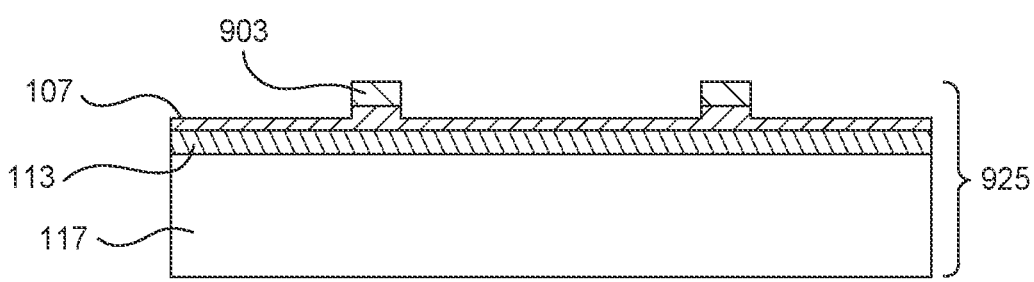
FIG. 9F
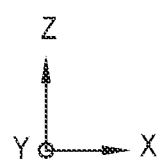

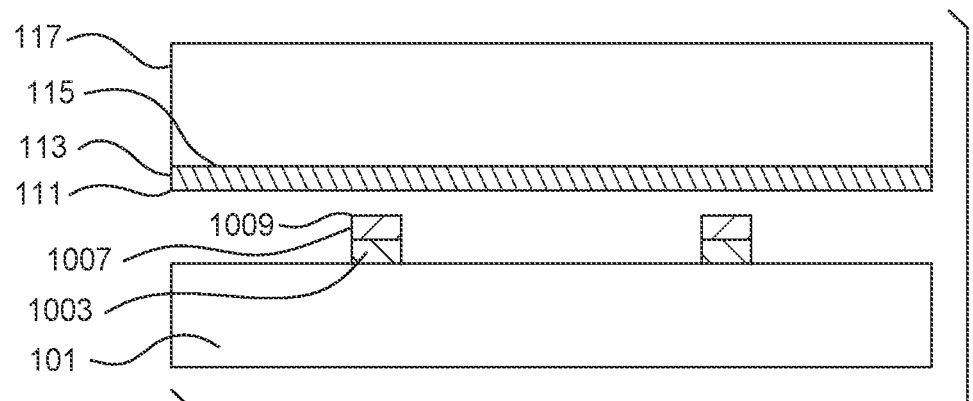
FIG. 10A
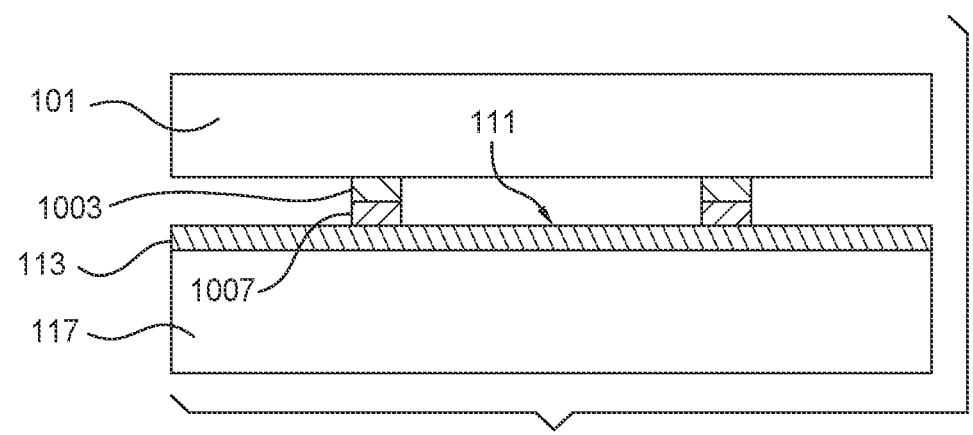
FIG. 10B
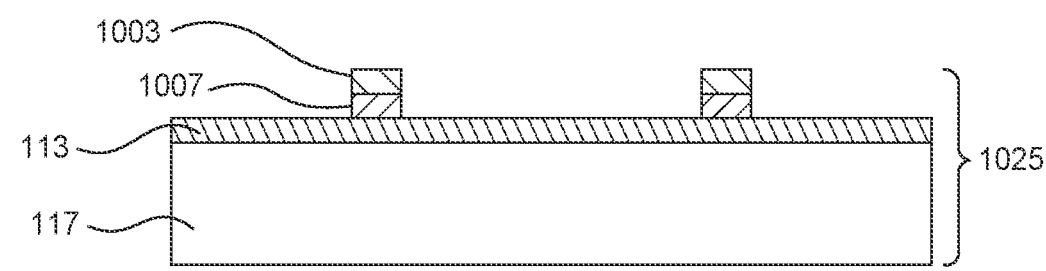
FIG. 10C
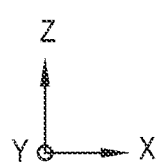

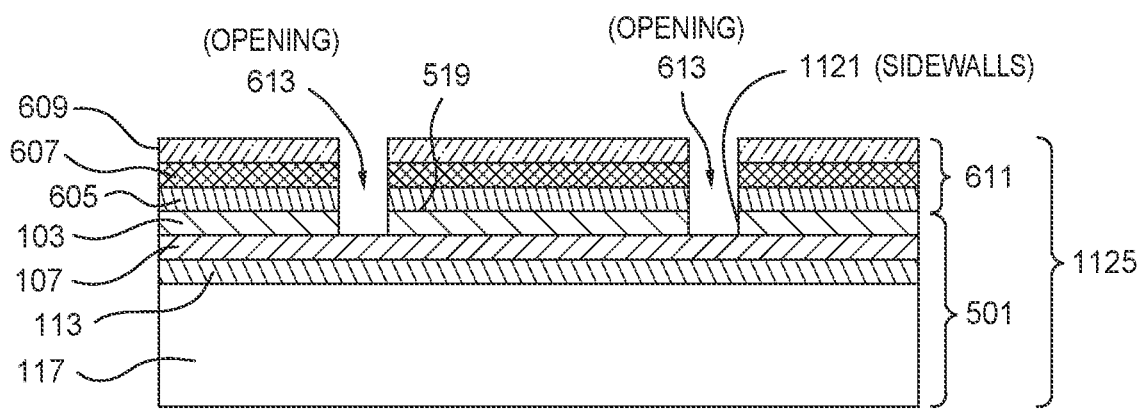
FIG. 11
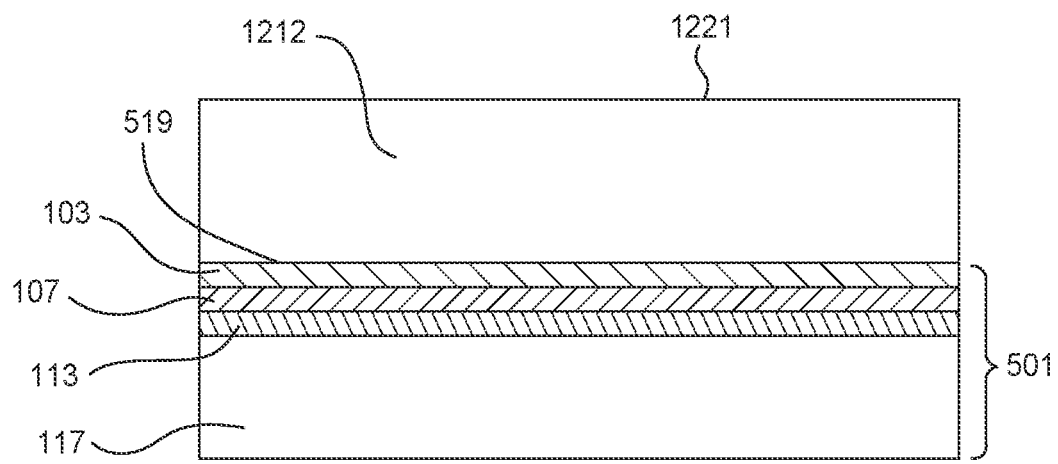
FIG. 12A
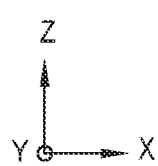

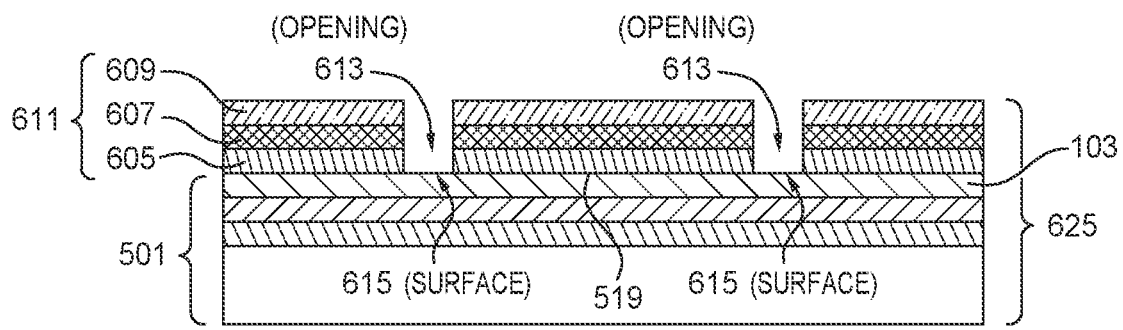
FIG. 12B
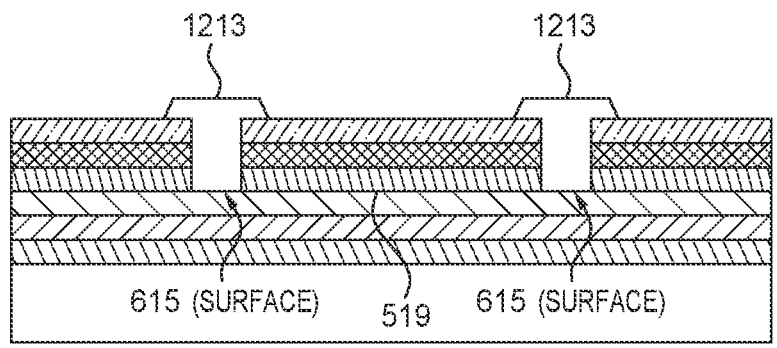
FIG. 12C
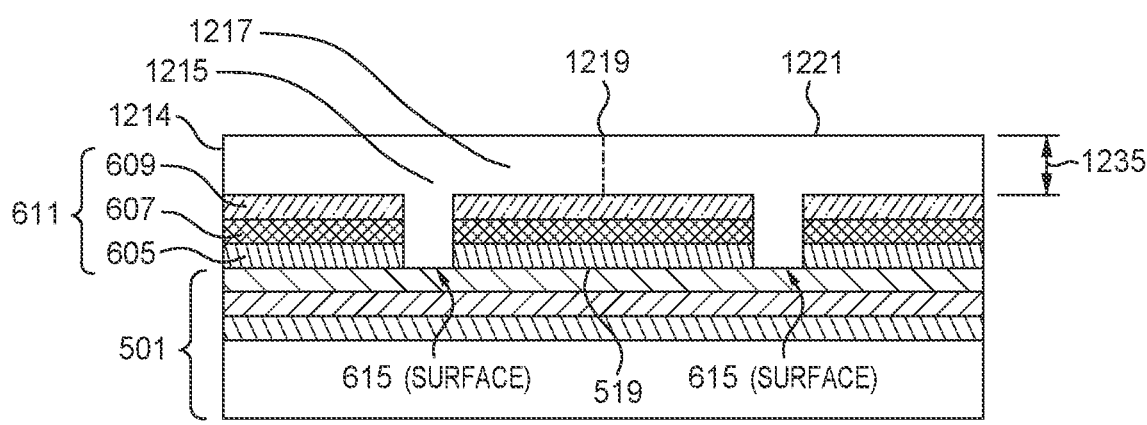
FIG. 12D
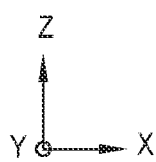

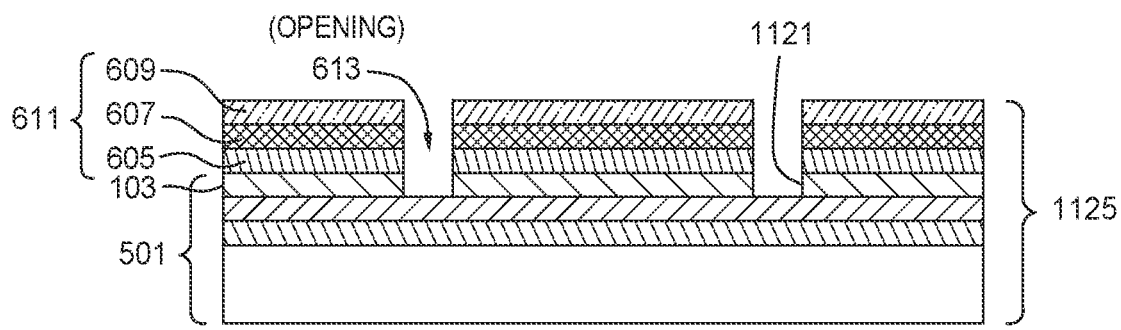
FIG. 12E
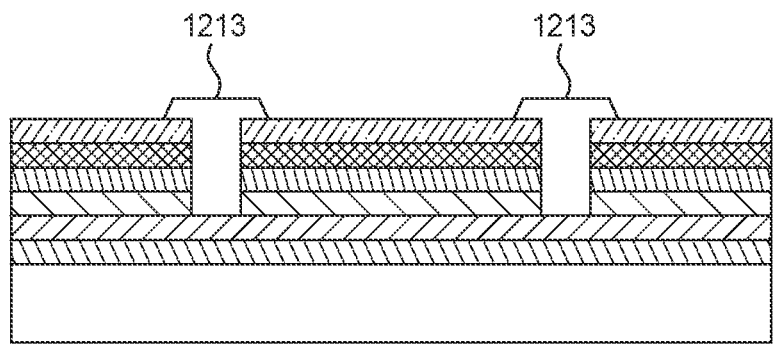
FIG. 12F
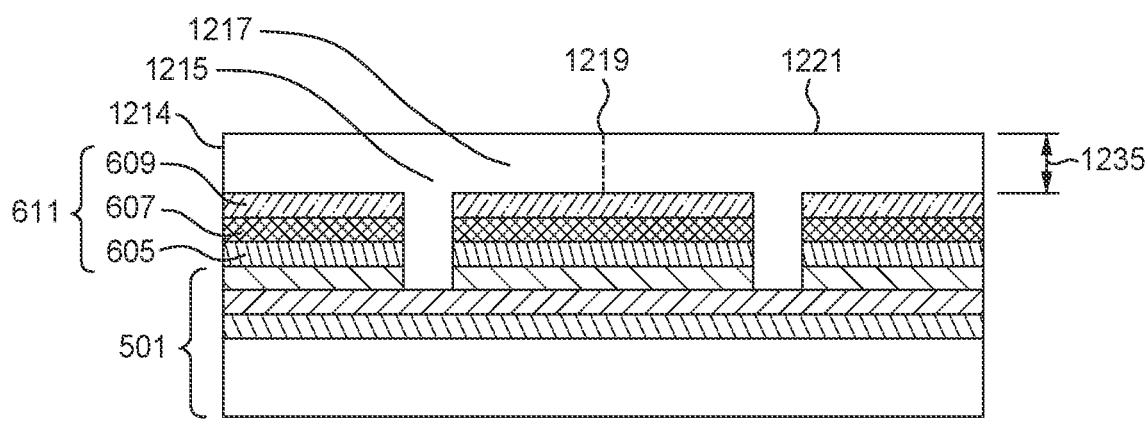
FIG. 12G
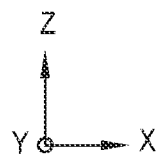

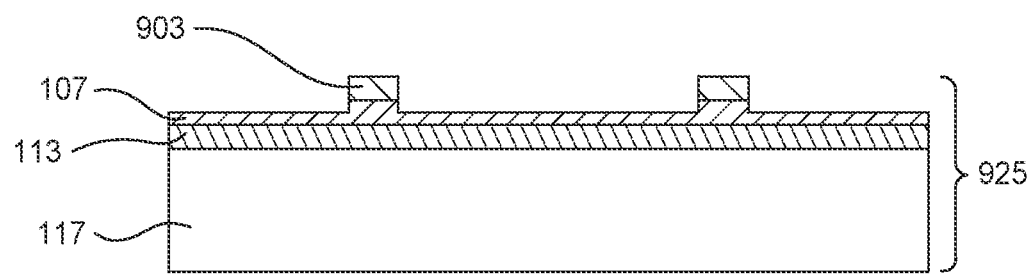
FIG. 12H
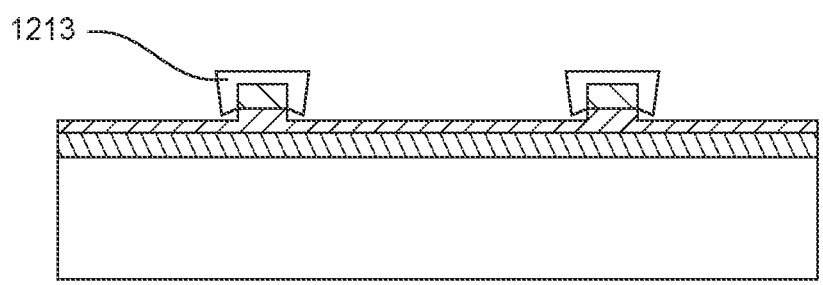
FIG. 12I
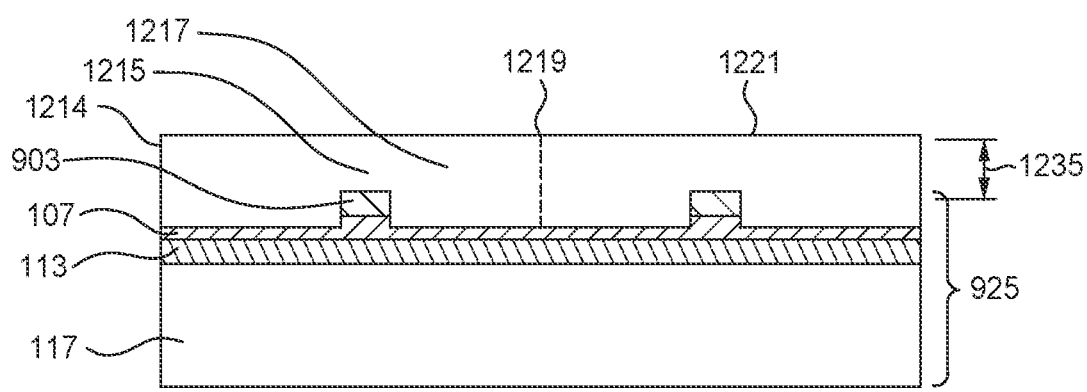
FIG. 12J
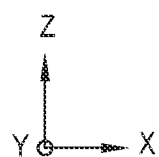

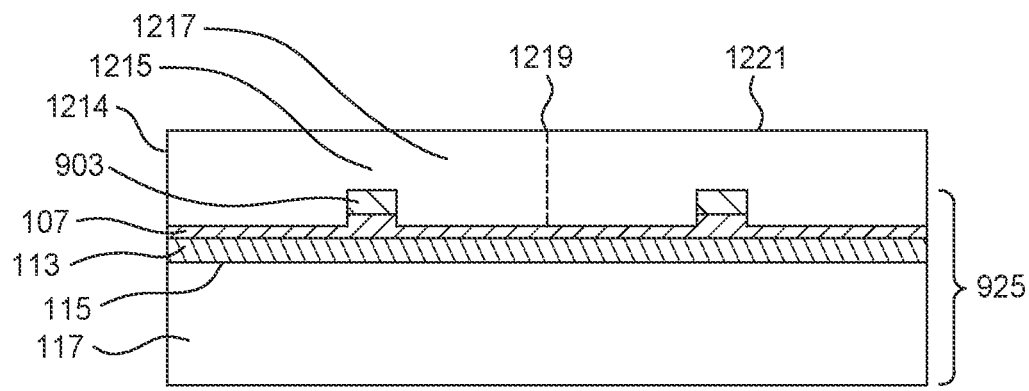
FIG. 13A
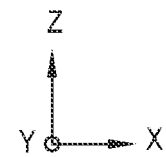
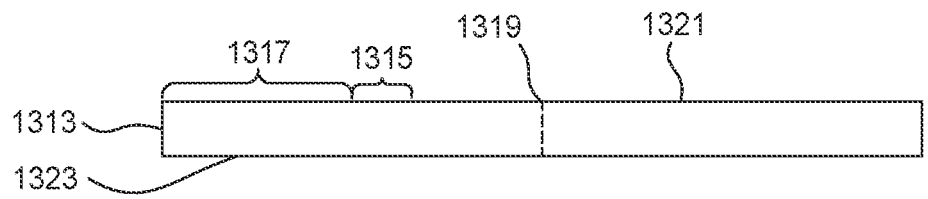
FIG. 13B
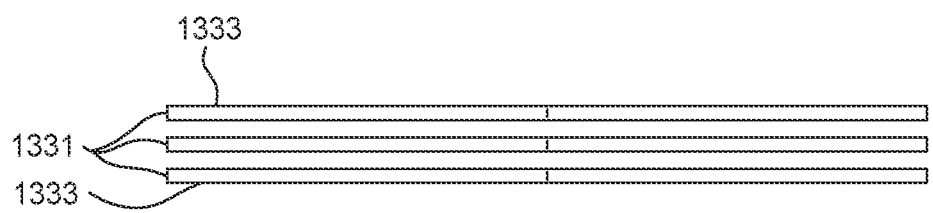
FIG. 13C

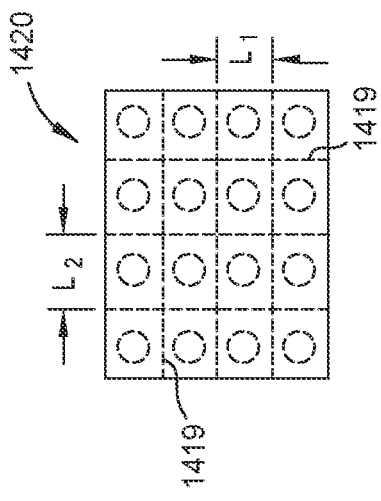
2D HEXAGONAL PATTERN
FIG. 14A
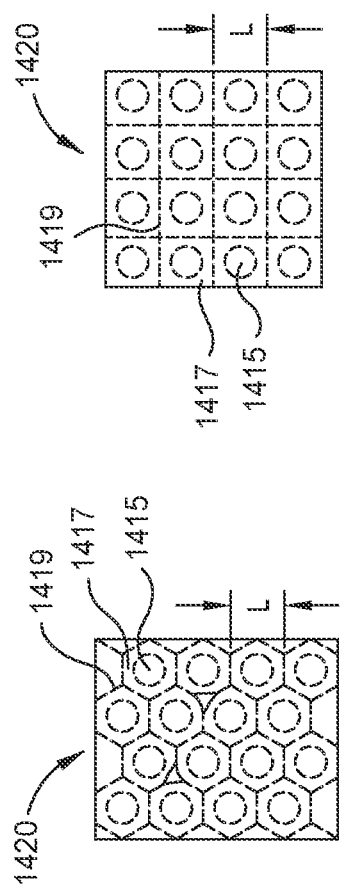
2D SQUARE PATTERN
FIG. 14B
2D RECTANGULAR PATTERN
FIG. 14C
1D LINEAR PATTERN
FIG. 14D
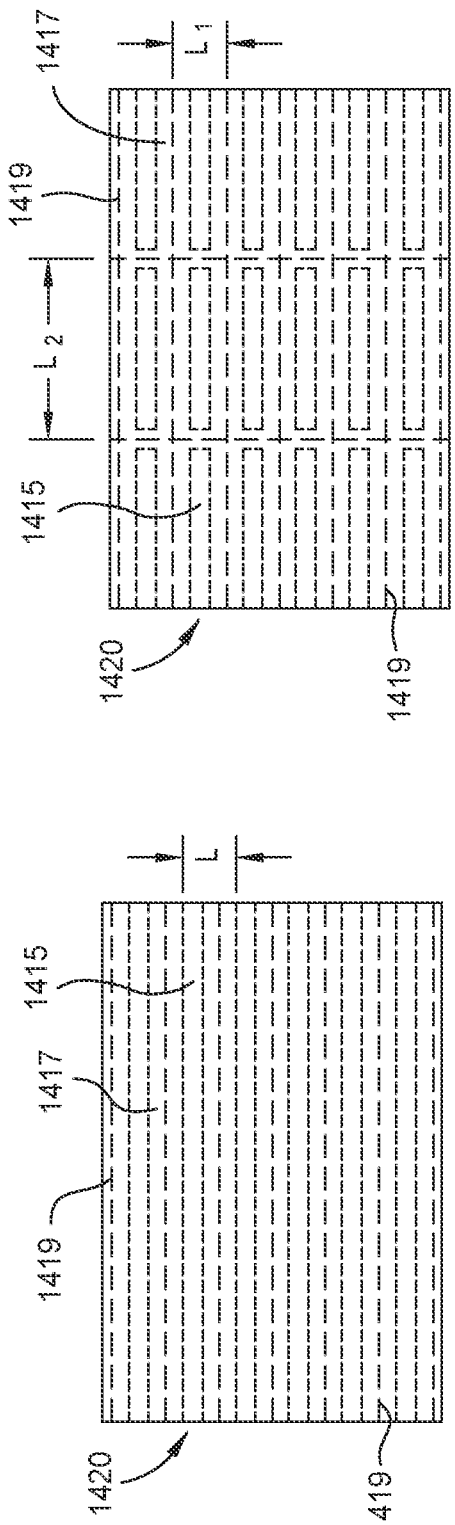
2D RECTANGULAR PATTERN
FIG. 14E

HIGH QUALITY GROUP-III METAL NITRIDE SEED CRYSTAL AND METHOD OF MAKING

CROSS-REFERENCE TO RELATED APPLICATIONS

This application claims the benefit to U.S. Provisional Application No. 62/962,087, filed Jan. 16, 2020, which is incorporated by reference herein.

BACKGROUND

Field

This disclosure relates generally to techniques for processing materials for manufacture of group-III metal nitride substrates, including gallium-containing nitride substrates. More specifically, embodiments of the disclosure include techniques for growing large area substrates using a combination of processing techniques. The disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting, hydrogen generation, photo detectors, integrated circuits, power diodes, transistors, and others.

Description of the Related Art

Gallium nitride (GaN) based optoelectronic and electronic devices are of tremendous commercial importance. The quality and reliability of these devices, however, is compromised by high defect levels, particularly threading dislocations, grain boundaries, and strain in semiconductor layers of the devices. Threading dislocations can arise from lattice mismatch of GaN based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth of the layers.

The presence of defects has a deleterious effect on subsequently grown epitaxial layers. Such effect includes compromising electronic device performance. To overcome these defects, techniques have been proposed that require complex, tedious fabrication processes to reduce the concentration and/or impact of the defects. While a substantial number of conventional growth methods for gallium nitride crystals have been proposed, limitations still exist. That is, conventional methods still merit improvement to be cost effective and efficient.

Progress has been made in the growth of large-area gallium nitride crystals with considerably lower defect levels than heteroepitaxial GaN layers. However, most techniques for growth of large-area GaN substrates involve GaN deposition on a non-GaN substrate such as sapphire, silicon, or GaAs, which provide the benefit of commercial availability in large diameter at modest cost. This approach generally gives rise to threading dislocations at average concentrations of $10^5$-$10^7$ cm$^{-2}$ over the surface of thick boules, as well as significant bow, stress, and strain. In addition, the strain results in a crystallographic radius of curvature of, typically, about 1 to 10 meters and a variation in the crystallographic miscut across the diameter of 50 mm or 100 mm wafers prepared from these boules in the range of 0.1 to 1 degree or more. Reductions in the concentration of threading dislocations and in miscut variation are desirable for a number of applications. Bow, stress, and strain can cause low yields when slicing the boules into wafers, make the wafers susceptible to cracking during down-stream processing, and may also negatively impact device reliability and lifetime. Miscut variation causes variable uptake of various species during the growth of epitaxial layers. For example, variable uptake of indium causes variation in the emission wavelength of LED or laser device structures across a wafer, requiring device makers to measure the output of each individual device and to bin accordingly, raising cost. Miscut variation has also been found to decrease the reliability and lifetime of power devices such as diodes and transistors. A further consequence of bow, stress, and strain is that, during growth in m-plane and semipolar directions, even by near-equilibrium techniques such as ammonothermal growth, significant concentrations of stacking faults may be generated. In addition, the quality of c-plane growth may be unsatisfactory, due to formation of cracks, multiple crystallographic domains, and the like. Capability to manufacture substrates larger than 4 inches is currently very limited, as is the capability to produce large-area GaN substrates with a nonpolar or semipolar crystallographic orientation.

Ammonothermal crystal growth has a number of advantages over hydride vapor phase epitaxy (HVPE) as a means for manufacturing GaN boules. However, the performance of ammonothermal GaN crystal growth processing may be significantly dependent on the size and quality of seed crystals. Seed crystals fabricated by conventional HVPE methods may suffer from both a lattice mismatch with respect to newly-grown ammonothermal material and also from many of the limitations described above, and large area ammonothermally-grown crystals are not widely available.

Due to at least the issues described above, there is a need for a substrate that has a lower defect density and is formed by a technique that improves the crystal growth process.

BRIEF SUMMARY OF THE DISCLOSURE

According to the present disclosure, further techniques related to techniques for processing materials for manufacture of gallium based substrates are provided. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

Embodiments of the disclosure include a method for forming a free-standing group III metal nitride crystal, comprising coupling a handle substrate to a template, wherein the template comprises a template substrate and a group III metal nitride layer, the template substrate has a first surface on which the group III metal nitride layer is disposed, and the template substrate comprises one of sapphire, silicon carbide, silicon, gallium arsenide, germanium, a silicon-germanium alloy, $MgAl_2O_4$ spinel, ZnO, $ZrB_2$, BP, InP, AlON, $ScAlMgO_4$, $YFeZnO_4$, MgO, $Fe_2NiO_4$, $LiGa_5O_8$, $Na_2MoO_4$, $Na_2WO_4$, $In_2CdO_4$, lithium aluminate (LiAlO$_2$), LiGaO$_2$, Ca$_8$La$_2$(PO$_4$)$_6$O$_2$, gallium nitride (GaN), or aluminum nitride (AlN), the handle substrate is polycrystalline and has a coefficient of thermal expansion in a first direction that is equal to that of the group III metal nitride layer in the first direction, to within about 15%, between room temperature and about 700 degrees Celsius, the handle substrate comprises substantially the same composition as the group III metal nitride layer, and the first direction is parallel to the first surface; and removing the template substrate to form a group III metal nitride composite substrate, wherein the group III metal nitride composite substrate has an exposed surface that comprises at least a portion of the group III metal nitride layer.

Embodiments of the disclosure may further include a method for forming a free-standing group III metal nitride crystal, comprising coupling a handle substrate to a template, wherein the template comprises a template substrate and a group III metal nitride layer, wherein the group III metal nitride layer is disposed over a first surface of the template substrate, and the handle substrate is polycrystalline and has a coefficient of thermal expansion in a first direction that is within ±15% of the group III metal nitride layer between room temperature and about 700 degrees Celsius and comprises substantially the same composition as the group III metal nitride layer, wherein the first direction is parallel to the first surface; removing the template substrate to form a group III metal nitride composite substrate, wherein the group III metal nitride composite substrate has an exposed surface that comprises a pattern of isolated growth center regions that each comprise at least a portion of the group III metal nitride layer; and growing a group III metal nitride crystalline material from the pattern of isolated growth center regions vertically and laterally to form a bulk-grown group III metal nitride layer, wherein portions of the group III metal nitride crystalline material grown between two or more adjacent growth centers coalesce.

A further understanding of the nature and advantages of the present disclosure may be realized by reference to the specification and attached drawings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 1A and 1B are simplified cross-sectional views illustrating a method of forming a template substrate and a handle substrate with wafer-bonding layers according to an embodiment of the present disclosure.

FIG. 3 is a simplified cross-sectional view of a wafer-bonded template and a handle substrate according to an embodiment of the present disclosure.

FIG. 4 is a simplified cross-sectional view of a handle layer formed on a template substrate according to an embodiment of the present disclosure.

FIGS. 7A-7E are simplified plan views illustrating mask patterns or growth centers on a composite seed crystal according to an embodiment of the present disclosure.

FIGS. 9A-9C are simplified cross-sectional views illustrating a method of forming a patterned photoresist layer on a composite substrate according to an embodiment of the present disclosure.

FIGS. 9D-9F are simplified cross-sectional views illustrating a method of forming a patterned seed crystal including a mesa pattern with isolated growth centers on a composite substrate, according to an embodiment of the present disclosure.

FIGS. 10A-10C are simplified cross-sectional views illustrating an alternative method for forming a patterned seed crystal including isolated growth centers on a composite substrate, according to an embodiment of the present disclosure.

FIG. 11 is a simplified cross-sectional view illustrating an alternative method of forming a patterned seed crystal including isolated growth centers on a composite substrate according to an alternative embodiment of the present disclosure.

FIG. 12A is a simplified cross-sectional view illustrating a bulk crystal growth on a composite substrate, according to an embodiment of the present disclosure.

FIGS. 12B-12D are simplified cross-sectional views illustrating an epitaxial lateral overgrowth process for forming a large area group III metal nitride crystal, according to an embodiment of the present disclosure.

FIGS. 12E-12G are simplified cross-sectional views illustrating another epitaxial lateral overgrowth process for forming a large area group III metal nitride crystal according to an embodiment of the present disclosure.

FIGS. 12H-12J are simplified cross-sectional views illustrating yet another epitaxial lateral overgrowth process for forming a large area group III metal nitride crystal according to an embodiment of the present disclosure.

FIGS. 13A-13C are simplified cross-sectional views illustrating a method of forming a free-standing group III metal nitride boule and free-standing group III metal nitride wafers.

FIGS. 14A-14E are simplified plan views illustrating threading dislocation patterns on a free-standing group III metal nitride boule or wafer according to an embodiment of the present disclosure.

Figure 2A:
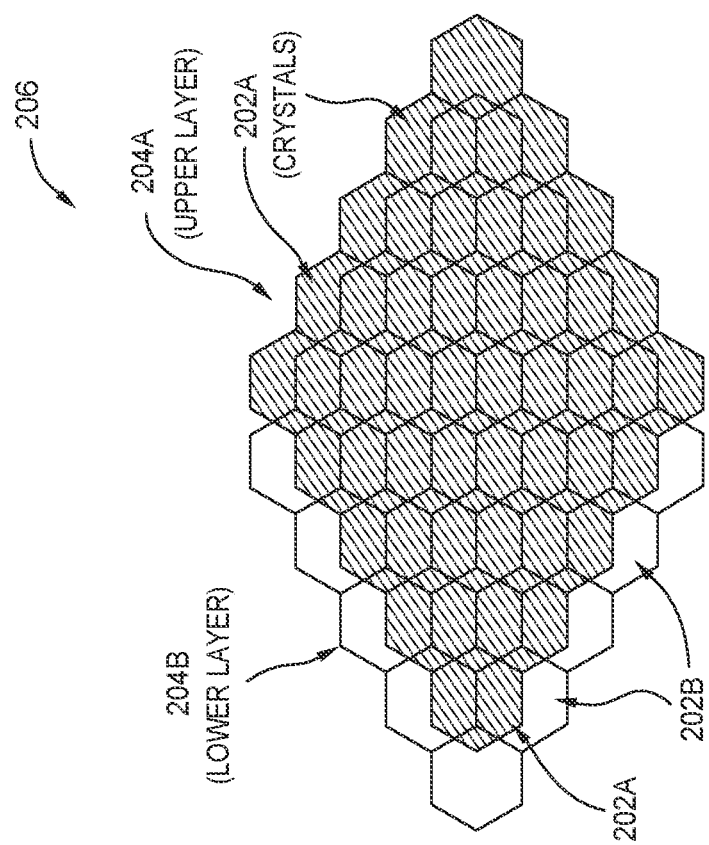
FIGS. 2A and 2B are simplified diagrams illustrating methods of forming a handle substrate according to an embodiment of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION OF THE DISCLOSURE

According to the present disclosure, techniques related to techniques for processing materials for manufacture of group-III metal nitride and gallium based substrates are provided. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

Threading dislocations in GaN are known to act as strong non-radiative recombination centers which can severely limit the efficiency of GaN-based LEDs and laser diodes. Non-radiative recombination generates local heating which may lead to faster device degradation (Cao et al., *Microelectronics Reliability*, 2003, 43(12), 1987-1991). In high-power applications, GaN-based devices suffer from decreased efficiency with increasing current density, known as droop. There is evidence suggesting a correlation between dislocation density and the magnitude of droop in LEDs (Schubert et al., *Applied Physics Letters*, 2007, 91(23), 231114). For GaN-based laser diodes there is a well-documented negative correlation between dislocation density and mean time to failure (MTTF) (Tomiya et al., *IEEE Journal of Selected Topics in Quantum Electronics*, 2004, 10(6), 1277-1286), which appears to be due to impurity diffusion along the dislocations (Orita et al., *IEEE International Reliability Physics Symposium Proceedings*, 2009, 736-740). For electronic devices, dislocations have been shown to markedly increase the leakage current (Kaun et al., *Applied Physics Express*, 2011, 4(2), 024101) and reduce the device lifetime (Tapajna et al., *Applied Physics Letters*, 2011, 99(22), 223501-223503) in HEMT structures. One of the primary advantages of using bulk GaN as a substrate material for epitaxial thin film growth is a large reduction in the concentration of threading dislocations in the film. Therefore, the dislocation density in the bulk GaN substrate will have a significant impact on the device efficiency and the reliability.

As noted above, lateral epitaxial overgrowth (LEO) is a method that has been widely applied to improvement in the crystallographic quality of films grown by vapor-phase methods. For example, methods have been reported whereby GaN layers were nucleated on a sapphire substrate, a $SiO_2$ mask with a periodic array of openings was deposited on the GaN layer, and then GaN was grown by metalorganic chemical vapor deposition (MOCVD) through the openings in the $SiO_2$ mask layer, grew laterally over the mask, and coalesced. The dislocation density in the areas above the openings in the mask were very high, similar to the layer below the mask, but the dislocation density in the laterally-overgrown regions formed between the openings was orders of magnitude less. This method is attractive because it can be applied to large area substrates, significantly reducing their dislocation density. Similar methods, with variations, have been applied by a number of groups to vapor-phase growth of GaN layers. These methods are variously referred to as LEO, epitaxial lateral overgrowth (ELO or ELOG), selective area growth (SAG), and dislocation elimination by epitaxial growth with inverse pyramidal pits (DEEP), or the like. In the case of essentially all variations of this method, it is believed a thin heteroepitaxial GaN layer is grown on a non-GaN substrate, a patterned mask is deposited on the GaN layer, and growth is re-initiated in a one-dimensional or two-dimensional array of openings in the mask. The period or pitch of the growth locations defined by the openings in the mask is typically between 2 and 400 micrometers, most typically between about 5 and 100 micrometers. The individual GaN crystallites, or regions, grow and then coalesce. Epitaxial growth may then be continued on top of the coalesced GaN material to produce a thick film or "ingot." A relatively thick GaN layer may then be deposited on the coalesced GaN material by HVPE. The LEO process is capable of large reductions in the concentration of dislocations, particularly in the regions above the mask, typically to levels of about $10^5$-$10^7$ cm$^{-2}$. However, the laterally-grown wings of the formed LEO layer may be crystallographically tilted from the underlying substrate ("wing tilt"), by as much as several degrees, which may be acceptable for a thin-film process but may not be acceptable for a bulk crystal growth process, as it may give rise to stresses and cracking as well as unacceptable variation in surface crystallographic orientation.

Several factors limit the capability of the LEO method, as conventionally applied, to reduce the average dislocation density below about $10^5$ to $10^7$ cm$^{-2}$, or to reduce the miscut variation across a 50 or 100 mm wafer to below about 0.1 degree. First, the pitch of the pattern of openings formed in the mask layer tends to be modest, but larger pitches may be desirable for certain applications. Second, c-plane LEO growth is generally performed in the (0001), or Ga-face direction, which has at least two limitations. One limitation is that M-direction growth rates tend to be lower than those of (0001)-direction growth rates and semipolar (10-11) facets often form, with the consequence that the overall crystal diameter decreases with increasing thickness and making coalescence of large-pitch patterns difficult. In addition, another limitation is that growth in the (0001) direction tends to exclude oxygen, in stark contrast to growth in other crystallographic directions. As a consequence, there may be a significant lattice mismatch between a (0001)-grown HVPE crystal used as a seed and the crystal grown upon it by another technique. In addition, if semipolar facets form during the LEO process there may be a significant variation in oxygen (or other dopant) level, giving rise to lateral variations in the lattice constant and stresses that can cause cracking in the LEO crystal itself or in a crystal grown on the latter, used as a seed. Third, the coefficient of thermal expansion (CTE) of the substrate may be different than that of the LEO layer grown upon it, resulting in significant stress and possible cracking, particularly if the LEO layer is thicker than 50 micrometers. In the case of bulk GaN, the CTE has been reported by a number of authors, including C. Roder, S. Einfeldt, S. Figge, and D. Hommel in Physical Review B, Vol. 72, article 085218 (2005), who reported that the linear thermal expansion coefficients in the "a" and "c" lattice directions at room temperature were $4.30 \times 10^{-6}$/K and $3.84 \times 10^{-6}$/K, respectively. Over the temperature range of 25 to 700° C., the average values in the a and c directions were $6.05 \times 10^{-6}$/K and $5.24 \times 10^{-6}$/K, respectively.

Variations of the LEO method have been disclosed for other group III metal nitride growth techniques besides HVPE. In a first example, Jiang, et al. [US Pub. No. 2014/0147650, now U.S. Pat. No. 9,589,792] disclosed a process for ammonothermal LEO growth of group-III metal nitrides. However, due to the high reactivity of the ammonothermal environment, application of this method to large-area hetero-substrates or templates places very stringent requirements on the masking material. In a second example, Mori, et al. [U.S. Pub. No. 2014/0328742, now U.S. Pat. No. 9,834,859] disclosed a process for LEO growth of group-III metal nitrides in a sodium-gallium flux. However, in this method the coalescing crystallites typically have prominent semipolar facets, leading to significant lateral variation in the impurity content of coalesced crystals, and the thermal expansion mismatch between the coalesced nitride layer and a hetero-substrate, which includes a different material than the coalesced nitride layer, may cause uncontrolled cracking.

An alternative approach to fabrication of large-area group III nitride crystals is tiling, whereby "tile" crystals are carefully aligned to one another, placed on or bonded to a "handle" substrate, and coalesced by crystal growth. For example, Fujiwara (U.S. Pat. No. 7,964,477) disclosed a method of coalescing GaN tile crystals using HVPE as the crystal growth method, and D'Evelyn, et al. (U.S. Pat. No. 9,564,320) disclosed a method of arranging and coalescing GaN tile crystals using ammonothermal crystal growth. However, it can be quite difficult to accurately align the tile crystals, particularly if the number of tile crystals is large, and the tile boundaries typically have an elevated concentration of threading dislocations and may be susceptible to cracking. In addition, differences in the coefficient of thermal expansion (CTE) between the handle substrate, the bonding material, and the tile crystal can give rise to misorientation, stress, and cracking. Any incompatibilities with the growth environment, for example, ammonothermal, can give rise to undesirable contamination in the grown crystal. Finally, the finished crystal is limited in size to that of the available handle wafer.

Yet another approach to fabrication of large-area group III nitride crystals is layer transfer, whereby a group III nitride layer grown on a first substrate is transferred to a second substrate. For example, Pinnington, et al. (U.S. Pat. No. 8,101,498), disclosed a method for transferring a group III metal nitride layer to a CTE-matched substrate and D'Evelyn, et al. (U.S. Pat. No. 9,650,723) disclosed a method to further process such a structure for use as a seed crystal in ammonothermal growth. However, it is very difficult to precisely match the CTE over the entire temperature range if the handle substrate has a different composition than the group III metal nitride layer, even if the average CTE values are the same, since the CTE typically varies nonlinearly with temperature and the variation in the CTE from its average value over a range of temperatures differs for different materials. In addition, the latter method involves the use of mask materials that may not provide a perfectly-hermetic seal to the ammonothermal crystal growth environment, possibly exposing growing crystals to undesirable contaminants.

High quality seed crystals are important to most true bulk crystal growth processes that are used to form group-III metal nitride and gallium based substrates, and large area seed crystals are particularly useful to form group-III metal nitride and gallium based substrates by a method such as ammonothermal growth. However, most large-area gallium nitride crystals are currently grown by (0001)-direction HVPE, as noted above. In addition to the undesirable concentration of threading dislocations typically present in this HVPE formed material, there appears to be a small lattice mismatch between bulk GaN grown by (0001)-direction HVPE versus by other techniques, such as the high-nitrogen-pressure method and MOCVD (Darakchieva et al., *Journal of Crystal Growth*, 2008, 310(5), 959-965), which is on the order of 0.001 Å, corresponding to a strain on the order of $2.5 \times 10^{-4}$. The lattice mismatch between such (0001)-grown HVPE GaN and ammonothermal GaN may be larger, for example, approximately 0.003 Å, corresponding to a strain on the order of $8 \times 10^{-4}$. While these strain levels may appear to be small, even the smaller value nonetheless corresponds to a Matthews-Blakeslee critical thickness, which is used to predict the critical thickness at which dislocations will be formed in a strained epitaxial layer, of only about 0.8 micrometer. Above this thickness a bulk-on-HVPE GaN layer structure may reduce its energy by formation of dislocations, if an energetically-accessible mechanism for doing so exists. If energy relaxation by dislocation generation is not possible, in thicker layers relaxation may occur by the formation of cracks. Using the Matthews-Klokholm formulation, the critical thickness upon which cracking may occur is 3-10 micrometers for an ammonothermal film grown on HVPE GaN at 550° C., depending on the actual strain. For example, ammonothermal GaN layers on HVPE GaN seed crystals may form cracks for layers thicker than about 0.1 millimeter, about 0.2 millimeter, thicker than about 0.5 millimeter, thicker than about 1 millimeter, thicker than about 2 millimeters, or thicker than about 5 millimeters. It would thus be desirable to be able to tune the lattice constant of an HVPE-grown seed crystal to precisely match that of an ammonothermal crystal to be grown upon it, for example, by varying the doping level.

FIG. 1A is a schematic cross-sectional view illustrating a process step within a fabrication method of a seed crystal that can be used for large-area group III nitride crystal growth and avoids the limitations described above. Referring to FIG. 1A, a template substrate 101 is provided. Template substrate 101 preferably consists of or includes a substrate material that is a single crystal. The template substrate 101 can be a commercially available large diameter substrate that consists of or includes a material, such as sapphire ($Al_2O_3$), silicon carbide (SiC), or silicon. In alternative embodiments, template substrate 101 may consist of or include gallium arsenide, germanium, a silicon-germanium alloy, $MgAl_2O_4$ spinel, ZnO, $ZrB_2$, BP, InP, AlON, $ScAlMgO_4$, $YFeZnO_4$, MgO, $Fe_2NiO_4$, $LiGa_5O_8$, $Na_2MoO_4$, $Na_2WO_4$, $In_2CdO_4$, lithium aluminate ($LiAlO_2$), $LiGaO_2$, $Ca_8La_2(PO_4)_6O_2$, gallium nitride (GaN), aluminum nitride (AlN), or the like. One or both of the large-area surfaces of template substrate 101 may be polished and/or chemical-mechanically polished. In certain embodiments, template substrate 101 consists of or includes sapphire and has a large-area surface 102 that has a crystallographic orientation within 5 degrees, within 2 degrees, within 1 degree, or within 0.5 degree of (0001), (10-10), (10-12), (22-43), or (11-23). In certain embodiments, template substrate 101 consists of or includes sapphire and has a large-area surface 102 that is misoriented from (0001) by an angle between about 0.5 degree and about 8 degrees, or between about 2 degrees and about 4 degrees, toward the {11-20} a-plane, toward the {10-10} m-plane, or toward a-plane intermediate between a-plane and m-plane. In certain embodiments, template substrate 101 has a cubic structure and large-area surface 102 has a crystallographic orientation within 5 degrees, within 2 degrees, within 1 degree, or within 0.5 degree of {111}, {100}, {110}, or {114}. Other orientations may also be chosen. Large-area surface 102 may have a maximum lateral dimension between about 5 millimeters and about 600 millimeters and a minimum lateral dimension between about 1 millimeter and about 600 millimeters and template substrate 101 may have a thickness between about 10 micrometers and about 10 millimeters, or between about 100 micrometers and about 2 millimeters. In certain embodiments, template substrate 101 is substantially circular, with one or more orientation flats. In alternative embodiments, template substrate 101 is substantially rectangular. In certain embodiments, large-area surface 102 has a maximum dimension of about 50 mm, 100 mm, 125 mm, 150 mm, 200 mm, 250 mm, or 300 mm. The variation in the crystallographic orientation of the large-area surface 102 may be less than about 5 degrees, less than about 2 degrees, less than about 1 degree, less than about 0.5 degree, less than about 0.2 degree, less than about 0.1 degree, or less than about 0.05 degree.

Template substrate 101 may have a surface threading dislocation density less than about $10^7$ cm$^{-2}$, less than about $10^6$ cm$^{-2}$, less than about $10^5$ cm$^{-2}$, less than about $10^4$ cm$^{-2}$, less than about $10^3$ cm$^{-2}$, or less than about $10^2$ cm$^{-2}$. Template substrate 101 may have a stacking-fault concentration below about $10^4$ cm$^{-1}$, below about $10^3$ cm$^{-1}$, below about $10^2$ cm$^{-1}$, below about 10 cm$^{-1}$ or below about 1 cm$^{-1}$. Template substrate 101 may have a symmetric x-ray rocking curve full width at half maximum (FWHM) less than about 500 arcsec, less than about 300 arcsec, less than about 200 arcsec, less than about 100 arcsec, less than about 50 arcsec, less than about 35 arcsec, less than about 25 arcsec, or less than about 15 arcsec. Template substrate 101 may have a crystallographic radius of curvature greater than 10 meters, greater than 100 meters, or greater than 1000 meters, in at least one, at least two, or in three independent or orthogonal directions. In certain embodiments, template substrate 101 is patterned, with certain regions comprising (0001)-oriented facets exposed and other regions masked.

In certain embodiments, a group III metal nitride layer 103 is bonded to or formed on a surface 102 of the template substrate 101. Group III metal nitride layer 103 may include gallium and, together with template substrate 101, will hereinafter be referred to as template 104. Group III metal nitride layer 103 may be deposited by HVPE, by metalorganic chemical vapor deposition (MOCVD), molecular beam epitaxy (MBE), or the like. Group III metal nitride layer 103 may have a thickness between about 1 micrometer and about 1 millimeter, or between about 2 micrometers and about 100 micrometers, between about 3 micrometers and about 25 micrometers, or between about 5 micrometers and about 15 micrometers. In certain embodiments, group III metal nitride layer 103 has a wurtzite crystal structure and a crystallographic orientation within 5 degrees, within 2 degrees, within 1 degree, or within 0.5 degree of (0001)+c-plane, (000-1)-c-plane, {10-10} m-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 −1 ±2}, {1 0 −1 ±3}, {2 1 −3 ±1}, or {3 0 −3 ±4}. It will be understood that plane {3 0 −3 ±4} means the {3 0 −3 4} plane and the {3 0 −3 −4} plane. In certain embodiments, a nucleation layer (not shown) is present at the interface between template substrate 101 and group III metal nitride layer 103. In certain embodiments, the nucleation layer consists of or includes one or more of aluminum nitride, gallium nitride, and zinc oxide. In certain embodiments, the nucleation layer is deposited on template substrate 101 by at least one of low-temperature MOCVD, sputtering, and electron-beam evaporation. In certain embodiments, the nucleation layer has a thickness between about 1 nanometer and about 200 nanometers or between about 10 nanometers and about 50 nanometers.

Referring to FIG. 1B, a handle substrate 117 having surface 115 is also provided. In some embodiments, as will be discussed further below, an adhesion layer 113 having a surface 111 is disposed on the surface 115 of the handle substrate 117. Handle substrate 117 may consist of or include a substrate material that is a single crystal, polycrystalline or amorphous material. Handle substrate 117 may consist of or include sapphire, aluminum oxide, mullite, silicon, silicon nitride, germanium, gallium arsenide, silicon carbide, MgAl$_2$O$_4$ spinel, zinc oxide, indium tin oxide (ITO), indium oxide, tin oxide, indium phosphide, beryllium oxide, chemical-vapor-deposition (CVD) diamond, single crystal diamond, YAG: Ce, gallium nitride, indium nitride, gallium aluminum indium nitride, aluminum oxynitride, or aluminum nitride. Handle substrate 117 may consist of or include substantially the same composition as group III metal nitride layer 103. In certain embodiments, handle substrate 117 consists of or includes textured or highly-textured polycrystalline group III metal nitride. Since the CTE of GaN differs by approximately 12% between the a and c directions, for example, polycrystalline GaN will not have a precise CTE match to a single-crystal GaN layer. However, the mismatch is small and the temperature dependence of the CTE in the a and c directions are similar. In addition, in the limit that the polycrystalline GaN material is highly textured in the c-direction, its CTE in the lateral direction will closely approximate the CTE of single-crystal GaN in the a-direction. Exemplary methods for fabricating textured, polycrystalline group III metal nitride are described in U.S. Pat. Nos. 8,039,412 and 10,094,017, each of which is incorporated by reference in its entirety. In one specific embodiment, handle substrate 117 consists of or includes oxygen-doped aluminum nitride. In one specific embodiment, handle substrate 117 consists of or includes crystals that have been merged or tiled together using another method, as discussed further below.

In certain embodiments, handle substrate 117 consists of or includes one or more group III metal nitride single crystals, the group III metal nitride single crystals comprising substantially the same composition as group III metal nitride layer 103, enabling a very close match between the CTE of handle substrate 117 and group III metal nitride layer 103 over any temperature range. In certain embodiments, handle substrate 117 is fabricated by tiling, for example, as described below and in U.S. Pat. No. 9,564,320. In certain embodiments, handle substrate 117 is fabricated by a layer transfer process, for example, as described in U.S. Pat. No. 9,650,723. In certain embodiments, one or more single crystals within handle substrate 117 have a crystallographic orientation within about 10 degrees, within about 5 degrees, within about 2 degrees, or within about 1 degree of that of group III metal nitride layer 103. In certain embodiments, the one or more group III metal nitride single crystals within handle substrate 117 and group III metal nitride layer 103 have a c-plane orientation and an in-plane thermal expansion coefficient that is isotropic. In such embodiments, therefore, deviations in the azimuthal and polar crystallographic orientation of between different group III metal nitride single crystals, or tiled crystals within a composite, will have very little effect on the thermal expansion coefficient and its match to that of group III metal nitride layer 103. Handle substrate 117 may have a thermal expansion coefficient parallel to surface 115 (i.e., X-Y plane) between room temperature and about 700 degrees Celsius that is between about 2.5×10$^{-6}$ K$^{-1}$ and about 7×10$^{-6}$ K$^{-1}$. Handle substrate 117 may have a thermal expansion coefficient parallel to surface 115 between room temperature and about 700 degrees Celsius that is between about 5.5×10$^{-6}$ K$^{-1}$ and about 6.5×10$^{-6}$ K$^{-1}$. Handle substrate 117 may have a thermal expansion coefficient parallel to surface 115 between room temperature and about 700 degrees Celsius that within about 15%, within about 10% within about 5%, within about 2%, or within about 1% of that of group III metal nitride layer 103. Surface 115 of handle substrate 117 may be optically flat, with a deviation from flatness less than 1 micron, less than 0.5 micron, less than 0.2 micron, less than 0.1 micron, or less than 0.05 micron. Surface 115 may be very smooth, with a root-mean-square roughness less than 5 nanometers, less than 2 nanometers, less than 1 nanometer, less than 0.5 nanometer, less than 0.2 nanometer, less than 0.1 nanometer, or less than 0.05 nanometer, measured over an area of at least 10 microns×10 microns. Handle substrate 117 may be substantially transparent at visible wavelengths of light, such that one of ordinary skill in the art may be able to read printed words through handle substrate 117.

Figure 2B:
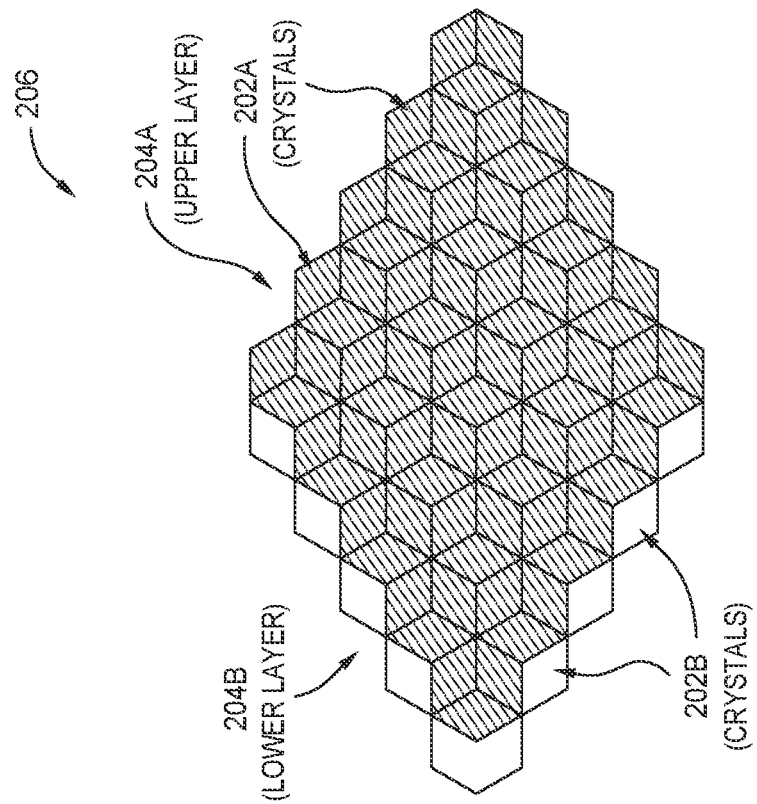

FIGS. 2A and 2B are schematic plan views of two examples of a bonded assembly 206 of handle-component crystals 202A, 202B that can be used in place of a single, large-area handle substrate 117 as shown in FIG. 1B, for fabrication of large-area group III nitride crystals. In this fabrication method, tile crystals are aligned to include overlapping placement of handle-component crystals 202A, 202B in at least two layers 204A, 204B, instead of being placed on or bonded to a large-area handle substrate 117. In preferred embodiments, handle-component crystals 202A, 202B have substantially the same composition as the group III metal nitride layer 103, thereby insuring an accurate match in the coefficient of thermal expansion over any temperature range between the handle-component crystals 202A, 202B and the group III metal nitride layer 103 after the handle-component crystals 202A, 202B are positioned on the group III metal nitride layer 103. In a specific embodiment, handle-component crystals 202A, 202B consist of or include wafers made of a group III nitride, for example, gallium nitride. As illustrated in FIGS. 2A-2B, edges of the handle-component crystals 202A, 202B have been trimmed into polygonal shapes to enable tessellation, that is, two-dimensional space-filling assembly. In the examples shown in FIGS. 2A and 2B, the handle-component crystals 202A, 202B have been trimmed into regular-hexagonal shapes of the same size. Alternative shapes, for example, triangles, squares, rectangles, parallelograms, or trapezoids, are also possible for tessellation. It may be useful, but is not necessary, for all the handle-component crystals 202A, 202B to have the same size or shape. Trimming of the edges may be accomplished with a dicing saw, a wire saw, a laser, by wire-electric-discharge-machining, by water-jet cutting, or the like. In certain embodiments, handle-component crystals 202A, 202B have a maximum lateral dimension between 10 and 160 millimeters, between 20 and 110 millimeters, or between 44 and 55 millimeters. In certain embodiments, handle-component crystals 202A, 202B have a thickness between about 50 micrometers and about 1200 micrometers, between about 200 and about 600 micrometers, or between about 250 and about 350 micrometers. In certain embodiments, handle-component crystals 202A, 202B have a thickness that is constant and uniform to within 5 micrometers or less, to within 2 micrometers or less, or to within 1 micrometer or less. In certain embodiments, each of handle-component crystals 202A, 202B has a bow that is less than about 25 micrometers, less than about 15 micrometers, less than about 10 micrometers, or less than about 5 micrometers. In certain embodiments, each of handle-component crystals 202A, 202B has a total thickness variation (TTV) that is less than about 5 micrometers, less than about 2 micrometers, or less than about 1 micrometer. In certain embodiments, the normal of each of handle-component crystals 202A, 202B has a crystallographic orientation that is within 5 degrees, within 2 degrees, within 1 degree, or within 0.5 degree of that of normal of each of the other handle-component crystals 202.

In certain embodiments, the handle-component crystals 202A, 202B are coated with adhesion layers (not shown). The adhesion layers may consist of or include at least one of Mg, Ca, Sr, Hf, Zr, B, Al, Si, P, Zn, Ga, Si, Ge, Sc, Y, R, where R is a rare earth element, Au, Ag, Ni, Ti, Cr, W, Mo, Ta, Zn, Cd, In, Sn, Sb, Tl, or Pb, or an oxide, nitride, oxynitride, or fluoride thereof. In a specific embodiment, the adhesion layers comprise Au or Ag with an underlayer of Ti, Cr, or TiW. The adhesion layers may be deposited by thermal evaporation, electron-beam evaporation, sputtering, chemical vapor deposition, plasma-enhanced chemical vapor deposition, or the like, or by thermal oxidation, nitridation, or fluorination of a deposited metallic film. The thickness of the adhesion layers may between about 1 nanometer and about 10 microns, or between about 10 nanometers and about 1 micron. The adhesion layer(s) may be annealed, for example, to a temperature between about 300 degrees Celsius and about 1000 degrees Celsius.

Referring again to FIGS. 2A and 2B, the handle-component crystals 202A, 202B may be tessellated (assembled two-dimensionally) in at least two vertically stacked layers 204A, 204B (Z-direction). Adjacent handle-component crystals 202A within the upper layer 204A and adjacent handle-component crystals 202B in the lower layer 204B may be in direct contact with one or more neighbors or may be separated by a gap. The separation gap may be small, for example, less than about 50 micrometers, less than about 25 micrometers, less than about 15 micrometers, less than about 10 micrometers, or less than about 5 micrometers. In certain embodiments, the azimuthal crystallographic orientations perpendicular to the layers 204A, 204B of the assembled handle-component crystals 202A, 202B are uniform to within 10 degrees, to within 5 degrees, to within 2 degrees, or within 1 degree. Each handle-component crystal 202A, 202B is bonded to 3 or 4 of its neighbors on the opposing layer 204B, 204A, creating a pattern that can be extended to any desired diameter, for example to greater than 100 millimeters, to greater than 150 millimeters, to greater than 200 millimeters, to greater than 250 millimeters, or to greater than 300 millimeters. In one example, as shown in FIG. 2A the left-most crystal 202A is bonded to four crystals 202B. FIGS. 2A and 2B illustrate two different spatial relationships or registries between upper layer 204A and lower layer 204B. In FIG. 2A, the upper layer 204A is positioned such that two adjoining edges of the upper layer 204A are centered above a handle-component crystal 202B in the lower layer 204B. In FIG. 2B, every other vertex or corner of handle-component crystals 202A in the upper layer 204A is centered above a handle-component crystal 202B in the lower layer 204B. Other arrangements are also possible. Once the handle-component crystals 202A, 202B have been arranged into at least two layers 204A, 204B, handle-component crystals 202A, 202B in the two layers 204A, 204B are bonded together. In one specific embodiment, bonding of the handle-component crystals 202A, 202B is achieved by wafer-bonding, for example, using well-known techniques as disclosed in "Semiconductor Wafer Bonding" by Q.-Y. Tong and U. Gosele. In another specific embodiment, bonding of the handle-component crystals 202A, 202B is achieved by brazing, that is, heating the assembly to a temperature above a solidus or melting point of the adhesion layers, followed by cooling. Other bonding methods are also possible.

After handle-component crystals 202A, 202B have been bonded to one another, the bonded assembly 206 of the handle-component crystals 202A, 202B may be further processed. For example, the edges of the layers 204A, 204B may be trimmed, sawed, or ground, and the front and back surfaces may be ground, lapped, polished, or the like. Optionally, one or more holes may be drilled or laser-drilled into the bonded assembly 206 to facilitate hanging during a subsequent ammonothermal crystal growth process.

In certain embodiments, handle substrate 117 is fabricated by tiling single crystals comprising approximately the same composition as group III metal nitride layer 103, which is referred to herein as a tiling method, and is discussed below. In certain embodiments, tile crystals are fabricated by trimming the edges of commercial c-plane GaN wafers to form hexagonal crystals with edges aligned approximately with a-planes. An adhesion layer comprising 20 nanometers of Ti and 1.5 micrometers of AuSn may be deposited on the N-faces of the tile crystals and onto a handle substrate comprising polycrystalline AlN. Each of the tile crystals, with their edges aligned approximately, may be wafer bonded to the handle substrate at a temperature of 450 degrees Celsius in vacuum, forming a bond. The GaN-on-handle tiled substrate may be placed in a silver capsule along with polycrystalline GaN nutrient, $NH_4F$ mineralizer, and ammonia, and sealed. The capsule may be placed an internally-heated high pressure apparatus, heated to a temperature of approximately 675 degrees Celsius for approximately 150 hours, and cooled. The gaps between adjacent tile crystals are closed by newly-formed GaN, causing coalescence of the tile crystals into a tiled composite. The handle substrate may be removed by dissolution of the Ti—Au adhesion layers, forming a free-standing, tiled GaN crystal, which may be used as a handle substrate for the present invention. Additional details of a tiling method are provided in U.S. Pat. No. 9,564,320, which is hereby incorporated by reference in its entirety.

Referring again to FIGS. 1A and 1B, adhesion layers 113 and 107 may be deposited on surface 115 of handle substrate 117 and on surface 105 of group III metal nitride layer 103. Handle substrate 117 may consist essentially of the bonded assembly 206 of handle-component crystals 202A, 202B as described above. Adhesion layers 113 and 107 may consist of or include at least one of Mg, Ca, Sr, Hf, Zr, B, Al, Si, P, Zn, Ga, Si, Ge, Sc, Y, R, where R is a rare earth element, Au, Ag, Ni, Ti, Cr, W, Mo, Ta, Zn, Cd, In, Sn, Sb, Tl, or Pb, or an oxide, nitride, oxynitride, or fluoride thereof. Adhesion layers 113 and/or 107 may be electrically insulating. Adhesion layers 113 and 107 may further include hydrogen. The adhesion layers 113 and 107 may be deposited by thermal evaporation, electron-beam evaporation, sputtering, chemical vapor deposition, plasma-enhanced chemical vapor deposition, or the like, or by thermal oxidation, nitridation, or fluorination of a deposited metallic film. The thickness of adhesion layers 113 and 107 may between about 1 nanometer and about 10 microns, or between about 10 nanometers and about 1 micron. One or both of the adhesion layers 113, 107 may be annealed, for example, to a temperature between about 300 degrees Celsius and about 1000 degrees Celsius. In some embodiments, at least one of the adhesion layer 113, 107 is chemical-mechanically polished. In a preferred embodiment, the root-mean-square surface roughness of at least one adhesion layer is below about 0.5 nanometer, or below about 0.3 nanometer over a 20×20 $\mu m^2$ area. In addition to enabling adhesion between group III metal nitride layer 103 and handle substrate 117, adhesion layers 113 and 107 may also serve as an etch stop and growth barrier during subsequent process steps within the fabrication method of a seed crystal that can be used for large-area group III nitride crystal growth.

Referring to FIGS. 1A and 1B and also to FIG. 3, surface 105 of template 104 or surface 109 of adhesion layer 107 placed on the template 104 and surface 115 of handle substrate 117 or surface 111 of adhesion layer 113 placed on the handle substrate 117 are placed in contact with one another and wafer-bonded. In a preferred embodiment, the wafer bonding operation is performed in a clean room, with less than 10,000, less than 1,000, less than 100, or less than 10 particles per cubic centimeter in the air. Particles may be removed from at least one of the surfaces immediately prior to wafer bonding by spraying, brushing, or rinsing with ionized nitrogen, a $CO_2$ jet, $CO_2$ snow, high-resistivity water, an organic solvent, such as methanol, ethanol, isopropanol, acetone, or the like. In some embodiments, surface 109 and surface 111 are brought into contact while immersed in a liquid. Optionally, at least one of surfaces 109 and 111 is exposed to a plasma prior to be brought into contact with the other surface to enhance wafer bonding.

Template substrate 101 may be pressed against handle substrate 117 with a pressure between about 0.1 megapascals and about 100 megapascals. In some embodiments, van der Waals forces are sufficient to obtain a good wafer bond and no additional applied force is necessary. Template substrate 101 and handle substrate 117 may be heated to a temperature between about 30 degrees Celsius and about 950 degrees Celsius, between about 30 degrees Celsius and about 400 degrees Celsius, or between about 30 degrees Celsius and about 200 degrees Celsius for a period between about 5 minutes and about 10 hours to strengthen the wafer bond. In some embodiments, heating of template substrate 101 and handle substrate 117 is performed while they are mechanically loaded against one another.

Referring to FIG. 4, in certain embodiments, handle substrate 117 is formed or deposited directly on group III metal nitride layer 103, for example, by CVD, by HVPE or by a process similar to that described in U.S. Pat. No. 10,094,017. In certain embodiments, a protective layer 418 is deposited on surface 105 of group III metal nitride layer 103 prior to depositing handle substrate 117. In certain embodiments, protective layer 418 consists of or includes at least one of Mg, Ca, Sr, Hf, Zr, B, Al, Si, P, Zn, Ga, Si, Ge, Sc, Y, R, where R is a rare earth element, Au, Ag, Ni, Ti, Cr, W, Mo, Ta, Zn, Cd, In, Sn, Sb, Tl, or Pb, or an oxide, nitride, oxynitride, or fluoride thereof. In certain embodiments, protective layer 418 is deposited by one or more of thermal evaporation, electron-beam evaporation, sputtering, chemical vapor deposition, plasma-enhanced chemical vapor deposition, high density plasma chemical vapor deposition, electron cyclotron resonance plasma chemical vapor deposition, atomic layer deposition or the like, or by thermal oxidation, nitridation, or fluorination of a deposited metallic film. The thickness of protective layer 418 may between about 1 nanometer and about 10 microns, or between about 10 nanometers and about 1 micron. Protective layer 418 may protect group Ill metal nitride layer 103 during the process steps associated with deposition of handle substrate 117 on group III metal nitride layer 103 and may also serve as an etch stop and growth barrier during subsequent process steps.

Figure 5:
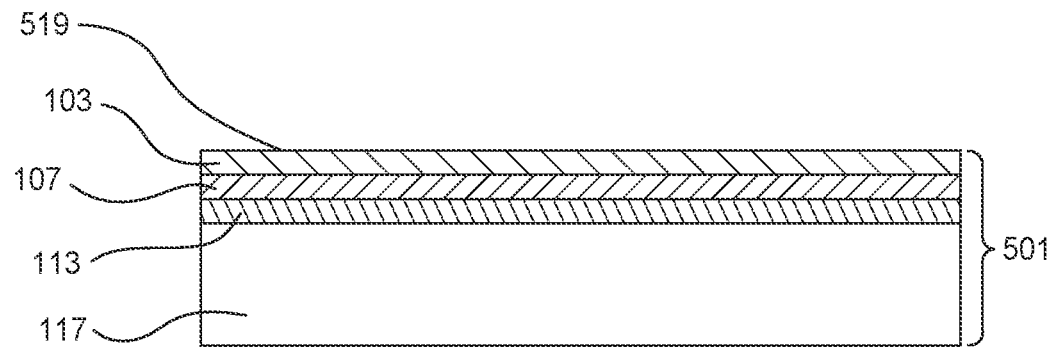
FIG. 5 is a simplified cross-sectional view of a composite substrate according to an embodiment of the present disclosure.

Referring to FIGS. 3 and 4 and also to FIG. 5, template substrate 101 is then removed to form composite substrate 501, that includes an exposed surface 519 of the group III metal nitride layer 103. In general, surface 519 has the opposite-signed crystallographic orientation as original surface 105 (shown in FIG. 1). For example, if surface 105 had a Ga-face, (0001) orientation, then surface 519 has a N-face, (000-1) orientation, and vice-versa. If surface 105 has an m-plane orientation then surface 519 has a similar m-plane orientation, but any miscut now is in the opposite direction (e.g., toward (0001) rather than toward (000-1)). If surface 105 has a semipolar orientation, e.g., (20-21), then surface

519 has an opposite-signed (20-2-1) orientation. In certain embodiments, template substrate 101 is removed by a selective chemical etching process. In a specific embodiment, template substrate 101 consists of or includes silicon and is removed by dissolution in a solution comprising at least one of HF and $HNO_3$. In another specific embodiment, template substrate 101 consists of or includes sapphire and is removed by dissolution in a melt comprising $KBF_4$, $Na_3AlF_6$, or another composition capable of selective dissolution of alumina, as described in U.S. Pat. No. 7,527,742, which is hereby incorporated by reference in its entirety. In certain embodiments, template substrate 101 is removed by grinding, lapping, polishing or other mechanical means. In certain embodiments, the template substrate is removed by laser ablation.

In certain embodiments, composite substrate 501 undergoes additional processing to form a composite seed crystal useful for bulk crystal growth, for example, ammonothermal crystal growth. In certain embodiments, where a nucleation layer was present at the interface between template substrate 101 and group III metal nitride layer 103 and is exposed by removal of template substrate 101, the nucleation layer may be removed by one or more of dry etching, wet etching, grinding, polishing, and chemical mechanical polishing. In certain embodiments, group III metal nitride layer 103 is thinned, for example, by wet etching, by dry etching, by lapping, by grinding, by polishing, or by chemical mechanical polishing. Referring again to FIG. 5, surface 519 of group III metal nitride layer 103 was previously in contact with or was in close proximity to template substrate 101, prior to removal of the latter, and may have an undesirably-high concentration of threading dislocations. Thinning of group III metal nitride layer 103 can provide one means of reducing the concentration of threading dislocations. In certain embodiments, one, two, or more holes is drilled in composite substrate 501 to facilitate hanging for ammonothermal crystal growth.

Figure 6:
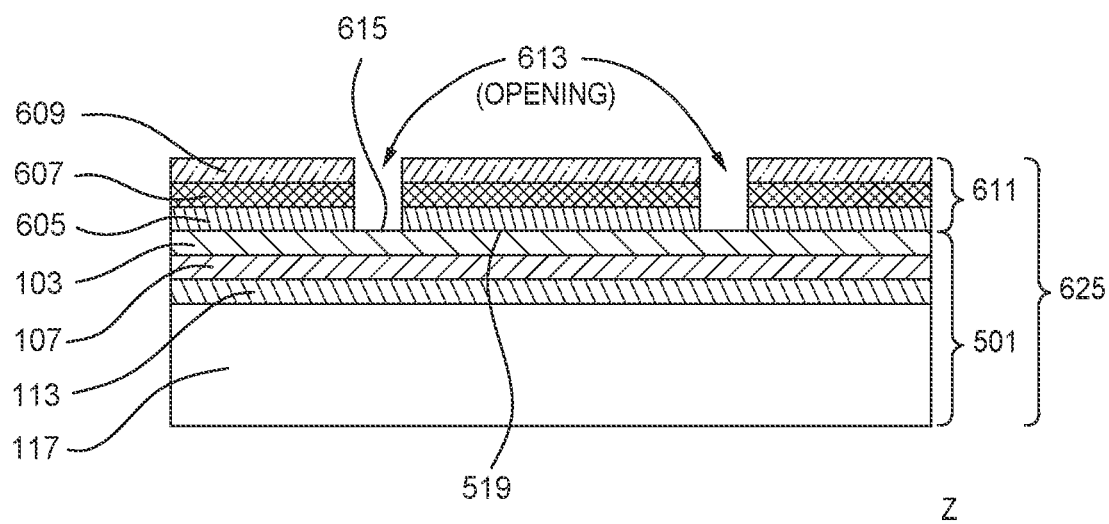
FIG. 6 is a simplified cross-sectional view illustrating a method of forming a patterned mask on a composite seed crystal according to an embodiment of the present disclosure.

In certain embodiments, a patterned mask layer 611 is applied to composite substrate 501, forming patterned composite substrate 625, as shown schematically in FIG. 6 and described in detail in U.S. Pat. No. 9,589,792, which is hereby incorporated by reference in its entirety. In one embodiment, prior to applying the patterned mask layer 611 a patterned resist layer (not shown) is formed on the exposed surface 519 of composite substrate 501 by conventional lithography techniques. Then one or more of adhesion layer 605, diffusion-barrier layer 607, and inert layer 609 may be deposited over the patterned photoresist layer, which is then followed by a lift-off process that removes the patterned photoresist and mask layer 611 that overlies the patterned photoresist material and thus forms the structure, illustrated in FIG. 6, in which portions 615 of the surface 519, on which the patterned resist was positioned, are exposed through openings 613. Adhesion layer 605 may consist of or include one or more of Ti, TiN, $TiN_y$, $TiSi_2$, Ta, $TaN_y$, Al, Ge, $Al_xGe_y$, Cu, Si, Cr, V, Ni, W, $TiW_x$, $TiW_xN_y$, or the like and may have a thickness between about 1 nanometer and about 1 micrometer. Diffusion-barrier layer 607 may consist of or include one or more of TiN, $TiN_y$, $TiSi_2$, W, $TiW_x$, $TiN_y$, $WN_y$, $TaN_y$, $TiW_xN_y$, $TiW_xSi_zN_y$, TiC, TiCN, Pd, Rh, Cr, or the like, and have a thickness between about 1 nanometer and about 10 micrometers. Inert layer 609 may consist of or include one or more of Au, Ag, Pt, Pd, Rh, Ru, Ir, Ni, Mo, Cr, V, Ti, or Ta and may have a thickness between about 10 nanometers and about 100 micrometers. The one or more mask layers may be deposited by sputter deposition, thermal evaporation, electron-beam evaporation, or the like. In certain embodiments, a relatively thin portion of inert layer 609, for example, 10 to 500 nanometers thick, is deposited prior to the lift-off process. After performing the lift-off process, an additional, thicker portion of inert layer 609, for example, 3 to 100 micrometers thick, may be deposited over the already-patterned relatively thin portion of inert layer 609 by electroplating, electroless deposition, or the like.

Other methods besides the lift-off procedure described above may be used to form the patterned mask layer 611, including shadow masking, positive resist reactive ion etching, wet chemical etching, ion milling, laser ablation, and nanoimprint lithography, plus variations of the negative resist lift-off procedure described above. In certain embodiments, a blanket mask layer is deposited over the exposed surface 519, which is then patterned by means of a lithography process that is then followed by wet or dry etching process or by means of laser ablation.

Figure 8B:
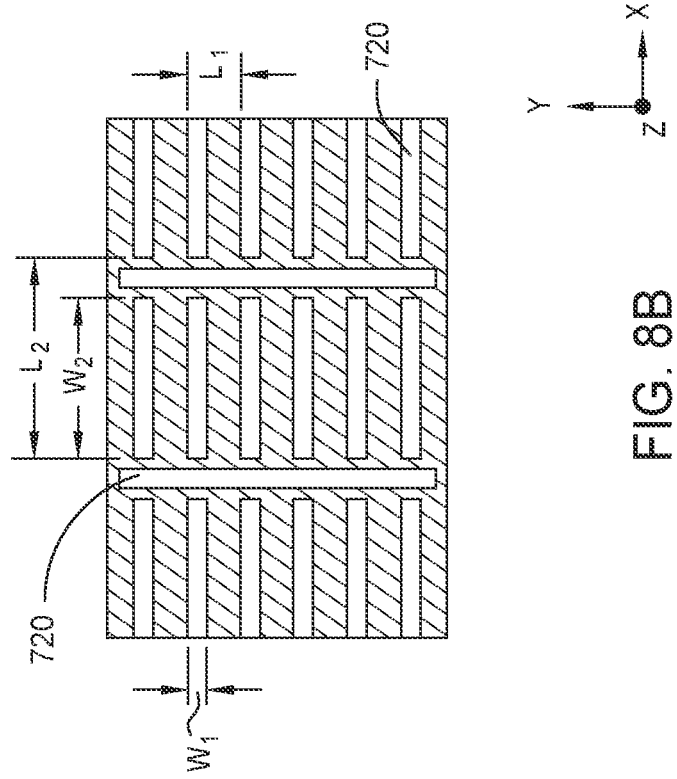
FIGS. 8A and 8B are simplified plan views illustrating mask patterns or growth centers on a composite seed crystal according to an embodiment of the present disclosure.
Figure 8A:
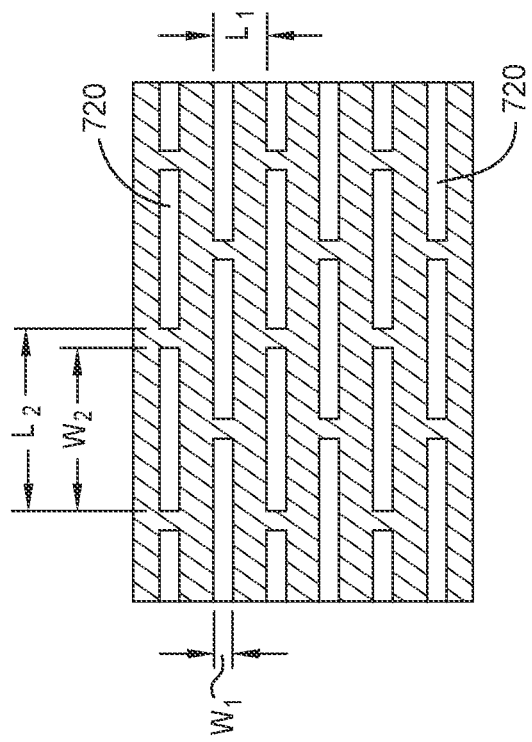

FIGS. 7A-7E and 8A-8B are plan, or top views of arrangements of exposed regions 720 on the composite substrate 501 formed by one or more of the processes described above. The exposed regions 720 (or also referred to herein as growth centers) may include openings 613 formed in patterned mask layer(s) 611 shown in FIG. 6, openings 908 shown in FIG. 9C, or the mesas 903 shown in FIG. 9F. In certain embodiments, the exposed regions 720 are arranged in a one-dimensional (1 D) array in the y-direction, such as a single column of exposed regions 720 as shown in FIG. 7D. In certain embodiments, the exposed regions 720 are arranged in a two-dimensional (2D) array in X- and Y-directions, such as shown in FIGS. 7A-7C, 7E and 8A-8B. The exposed regions 720 may be round, square, rectangular, triangular, hexagonal, or the like, and may have an opening dimension or diameter W between about 1 micrometer and about 5 millimeters, between about 2 micrometers and about 500 micrometers, or between about 5 micrometers and about 50 micrometers, such as illustrated in FIGS. 7A-7C. The exposed regions 720 may be arranged in a hexagonal or square array with a pitch dimension L between about 5 micrometers and about 20 millimeters or between about 200 micrometers and about 5 millimeters, or between about 500 micrometers and about 2 millimeters, such as illustrated in FIGS. 7A-7D. The exposed regions 720 may be arranged in a 2D array, in which the pitch dimension $L_1$ in the y-direction and pitch dimension $L_2$ in the x-direction may be different from one another, as illustrated in FIGS. 7E and 8A-8B. The exposed regions 720 may be arranged in a rectangular, parallelogram, hexagonal, or trapezoidal array (not shown), in which the pitch dimensions $L_1$ in the y-direction and $L_2$ in the x-direction may be different from one another. The array of exposed regions 720 may also be linear or irregular shaped. The exposed regions 720 may be placed in registry with the crystal structure of surface 519 of composite substrate 501. For example, in certain embodiments, surface 519 of the composite substrate 501 is hexagonal, e.g., a (0001) or (000-1) crystallographic orientation, and the exposed regions 720 comprise a 2D hexagonal array such that the separations between nearest-neighbor exposed regions 720 are parallel to <11-20> or <10-10> directions in surface 519 of the composite substrate 501. In certain embodiments, surface 519 of the composite substrate 501 is nonpolar or semipolar and the exposed regions 720 are arranged in a 2D square or rectangular array such that the separations between nearest-neighbor exposed regions 720 are parallel to the projections of two of the c-axis, an m-axis, and an a-axis on surface 519 of the composite substrate 501. In certain embodiments, the pattern of exposed regions 720 is obliquely oriented with respect to the structure of group III metal nitride layer 103, for example, where the exposed regions 720 are rotated by between about 1 degree and about 44 degrees with respect to a high-symmetry axis of group III metal nitride layer 103, such as a projection of the c-axis, an m-axis, or an a-axis on surface 519 of the composite substrate 501. In certain embodiments, the exposed regions 720 are substantially linear rather than substantially round. In certain embodiments, the exposed regions 720 are slits that run across the entire length of composite substrate 501, wherein each of the slits have a width W and are spaced from adjacent slits by a period L, as illustrated in FIG. 7D. In certain embodiments, the exposed regions 720 are slits that each have width $W_1$ in the y-direction and a predetermined length $W_2$ in the x-direction that is less than the length of the composite substrate 501 and may be arranged in a 2D linear array with period $L_1$ in the y-direction and period $L_2$ in the x-direction, as illustrated in FIG. 7E. In some embodiments, adjacent rows of exposed regions 720 (e.g., slits) may be offset in the x-direction from one another rather than arranged directly adjacent, as shown in FIG. 8A. In certain embodiments, the adjacent rows of exposed regions 720 (e.g., slits) may be offset in the longitudinal y-direction from one another. In certain embodiments, the exposed regions 720 include slits that extend in the x-direction and slits that extend in the y-direction, as shown in FIG. 8B. In other embodiments, the exposed regions 720 include slits that extend in directions that are rotated from one another by 60 degrees or a multiple thereof.

In certain embodiments, a process sequence, as shown in FIGS. 9A-9F, is performed such that portions of group III metal nitride layer 103 are removed to form mesas 903 (FIG. 9F), or isolated growth centers. Referring to FIG. 9A, a photoresist layer 921 may first be deposited on surface 519 of the composite substrate 501 by methods that are known in the art. For example, in a certain embodiment, a liquid solution of a negative photoresist is first applied to surface 519. Composite substrate 501 is then spun at a high speed (for example, between 1000 to 6000 revolutions per minute for 30 to 60 seconds), resulting in a uniform photoresist layer 921 on surface 519. Photoresist layer 921 may then be baked (for example, between about 90 and about 120 degrees Celsius) to remove excess photoresist solvent. After baking, the photoresist layer 921 may then be exposed to UV light through a photomask to form a patterned photoresist layer 922 (FIG. 9B) having a pre-determined pattern of cross-linked photoresist, such as cross-linked regions 922A and opening regions 922B. The patterned photoresist layer 922 may consist of or include stripes, dots, or other shapes having characteristic width or diameter W and pitch L. Photoresist layer 921 may then be developed to remove non-cross-linked material, as shown in FIG. 9C.

Referring to FIGS. 9C-9E, one or more dry-etch mask layers 923 may be deposited on surface 519, and thus the one or more dry-etch mask layers 923 are formed within openings 908 and onto patterned photoresist layer 922. Dry-etch mask layer 923 may consist of or include Ni, Ti, Cr, Al, $SiO_2$, $SiN_x$, or the like and may have a thickness between about 10 nanometers and about 100 micrometers. The one or more dry-etch mask layers 923 may be deposited by plasma-enhanced chemical vapor deposition, sputter deposition, thermal evaporation, electron-beam evaporation, or the like. After deposition of the one or more dry-etch masking layer(s) 923, the patterned portions of the one or more dry-etch layer(s) 923 residing above the patterned photoresist layer 922 is then lifted off along with the photoresist layer 921 by methods that are known in the art. Unmasked regions 902A of surface 519 may then be dry-etched, for example, by reactive ion etching or by means of an inductively-coupled plasma, using $CF_4$, $NF_3$, $Cl_2$, $BCl_3$, $SiCl_4$, or $CH_2Cl_2$ as a reagent gas to remove portions of the group III metal nitride layer 103 in the unmasked regions 902A of surface 519. The remaining portions of the dry-etch mask layer 923 are then removed, for example, by wet etching, to expose the formed mesas or isolated growth centers 903 on patterned seed crystal 925, as shown in FIG. 9F. In certain embodiments, the etching process may remove some or all of exposed areas of adhesion layer 107 and portions of adhesion layer 113 (or, alternatively, of protective layer 418 if the embodiment of FIG. 4 is employed). In preferred embodiments, however, at least a portion of adhesion layer 113 (or of protective layer 418) remains above handle substrate 117. Mesas 903 may be used to provide growth centers during a subsequent growth step, which is discussed further below. Growth centers 903 may be arranged in a two-dimensional (2D) array similar to those shown in FIGS. 7A-7C, 7E and 8A-8B. Another approach for fabricating the mesas 903 on surface 519 is to use a laser, for example, a $CO_2$ laser, a YAG laser, or a Ti:sapphire laser, to remove areas of the group III metal nitride layer 103 between the regions where the mesas 903 are to be formed. This laser ablation process may be used to generate a variety of patterns and geometries. In certain embodiments, one or more additional adhesion layers, diffusion-barrier layers, and/or inert layers are deposited on the assembly, covering the top surface of mesa 903, thereby inhibiting future growth on the top surface of the mesa and encouraging growth on the side surfaces of mesa 903. In certain embodiments, one or more additional adhesion layers, diffusion-barrier layers, and/or inert layers are deposited on the assembly, covering one or more sidewalls of mesa 903 and promoting future growth to occur primarily on top of the mesa 903.

In some embodiments, the layer-transferred, patterned seed crystal with isolated growth centers may be fabricated by other methods. FIGS. 10A-10C show an embodiment where a patterning process similar to FIGS. 9A-9F is performed to form a very similar structure to the patterned seed crystal 925 shown in FIG. 9F. In FIG. 10A, a template 104 (shown in FIG. 1A), including template substrate 101 and isolated growth center regions 1003 and patterned adhesion layers 1007 are provided. The isolated growth center regions 1003 and patterned adhesion layer 1007 are formed from a group III metal nitride layer 103 having a deposited adhesion layer 107 formed thereon by use of conventional patterning step(s) to form the patterned adhesion layers 1007 and isolated growth center regions 1003, but before the patterned adhesion layers 1007 are wafer-bonded to adhesion layer 113 of handle substrate 117. The patterning and etching process(es) leave the patterned adhesion layer 1007 above the isolated growth center region 1003 after the remaining portions of group III metal nitride layer 103 and adhesion layer 107 have been etched away. In some embodiments, a portion of template substrate 101 is also etched. Top surfaces 1009 of adhesion layer portions 1007 above isolated growth centers regions 1003 are then placed in contact with outer surface 111 of adhesion layer 113 on handle substrate 117 and wafer bonded, by an analogous process as that shown schematically in FIGS. 1A-1B. As noted above, removal of template substrate 101 provides a patterned seed crystal 1025, as shown in FIG. 10C, with a very similar structure as patterned seed crystal 925 shown in FIG. 9F.

Referring to FIG. 11, in yet another embodiment, the exposed portions of surface 519 of group III metal nitride layer 103, with patterned mask layer 611 disposed thereon, may be removed, for example, by one or more of wet etching, dry etching, and laser ablation, exposing sidewalls 1121 to form a patterned seed crystal within a patterned composite substrate 1125. In certain embodiments, one or more of adhesion layers 107 and/or 113 (or protection layer 418, if the configuration shown in FIG. 4 is employed) act as an etch stop to prevent removal of the handle substrate 117 through the exposed portions of group III metal nitride layer 103. In certain embodiments, one or more trenches formed between exposed sidewalls 1121, during the etching process, penetrates a depth into handle substrate 117.

Composite substrate 501, patterned composite substrate 625 or 1125, or patterned seed crystal 925 or 1025 may then be suspended on a seed rack and placed in a sealable container, such as a capsule, an autoclave, or a liner within an autoclave. In certain embodiments, one or more pairs of substrates are suspended back to back, with the patterned large-area surfaces facing outward. A group III metal source, such as polycrystalline group III metal nitride, at least one mineralizer composition, and ammonia (or other nitrogen containing solvent) are then added to the sealable container and the sealable container is sealed. The mineralizer composition may consist of or include an alkali metal such as Li, Na, K, Rb, or Cs, an alkaline earth metal, such as Mg, Ca, Sr, or Ba, or an alkali or alkaline earth hydride, amide, imide, amido-imide, nitride, or azide. The mineralizer may consist of or include an ammonium halide, such as $NH_4F$, $NH_4Cl$, $NH_4Br$, or $NH_4I$, a gallium halide, such as $GaF_3$, $GaCl_3$, $GaBr_3$, $GaI_3$, or any compound that may be formed by reaction of one or more of F, Cl, Br, I, HF, HCl, HBr, HI, Ga, GaN, and $NH_3$. The mineralizer may consist of or include other alkali, alkaline earth, or ammonium salts, other halides, urea, sulfur or a sulfide salt, or phosphorus or a phosphorus-containing salt. The sealable container may then be placed in a high pressure apparatus, such as an internally heated high pressure apparatus or an autoclave, and the high pressure apparatus sealed.

The sealable container, containing composite substrate 501, patterned composite substrate 625 or 1125, or patterned seed crystal 925 or 1025, is then heated to a temperature above about 400 degrees Celsius and pressurized above about 50 megapascal to perform ammonothermal crystal growth.

Referring to FIG. 12A, in one embodiment, during a bulk crystal growth process, for example, an ammonothermal crystal growth process, bulk group III metal nitride material grows vertically on surface 519 of group III metal nitride layer 103, forming bulk-grown group III metal nitride layer 1212. Bulk-grown group III metal nitride layer 1212 may have a thickness between about 10 micrometers and about 100 millimeters, or between about 100 micrometers and about 20 millimeters.

Referring to FIGS. 12B-12D, in another embodiment, during a bulk crystal growth process, for example, an ammonothermal crystal growth process, bulk group III metal nitride material 1213 grows vertically from exposed portions 615 of surface 519 of the group III metal nitride layer 103 of the composite substrate 501 (FIG. 11B) and through the openings 613 of patterned mask layer 611 on patterned composite substrate 625 (FIG. 12C), grows outward through the openings 613, grows laterally over patterned mask layer 611, and coalesces (FIG. 12D). After coalescence, bulk-grown group III metal nitride layer 1214 includes window regions 1215, which have grown vertically with respect to the openings in patterned mask layer 611, wing regions 1217, which have grown laterally over patterned mask layer 611, and coalescence fronts 1219, which form at the boundaries between wings growing from adjacent openings in patterned mask layer 611. The bulk-grown group III metal nitride layer 1214 has an exposed growth surface 1221 after performing the bulk crystal growth process. Bulk-grown group III metal nitride layer 1214 may have a thickness between about 10 micrometers and about 100 millimeters, or between about 100 micrometers and about 20 millimeters. The coalescence fronts 1219 may include a coalescence front region that includes a "sharp boundary" that has a width of less than about 25 micrometers or less than about 10 micrometers that is disposed between adjacent wing regions 1217 and extends through the thickness 1235 in the Z-direction, or an "extended boundary" that has a width between about 25 micrometers and about 1000 micrometers or between about 30 micrometers and about 250 micrometers that is disposed between adjacent wing regions 1217 and extends through the thickness 1235 in the Z-direction, depending on the growth conditions. The sharp boundary type of formed coalescence front regions include sets of threading dislocations that extend substantially vertically through the formed crystal, and the extended boundary type of formed coalescence front regions include sets of threading dislocations that tend to extend along a path that laterally meanders as the coalescent front extends vertically through the grown crystal. In certain embodiments the extended boundary type of formed coalescence fronts includes three or more locally-approximately-linear arrays of threading dislocations adjacent to one another.

Referring to FIGS. 12E-12G, in another embodiment, during a bulk crystal growth process, for example, an ammonothermal crystal growth process, bulk group III metal nitride material 1213 grows laterally from exposed sidewalls 1121 (FIG. 12E), vertically within the openings 613 of patterned mask layer 611 on patterned composite substrate 1125 (FIG. 12F), grows outward through the openings 613, grows laterally over patterned mask layer 611, and coalesces (FIG. 12G). After coalescence, bulk-grown group III metal nitride layer 1214 includes window regions 1215, which have grown vertically with respect to the openings 613 in patterned mask layer 611, wing regions 1217, which have grown laterally over patterned mask layer 611, and coalescence fronts 1219, which form at the boundaries between wings growing from adjacent openings in patterned mask layer 611. Bulk-grown group III metal nitride layer 1214 may have a thickness between about 10 micrometers and about 100 millimeters, or between about 100 micrometers and about 20 millimeters. By comparison to the embodiment shown in 12B-12D, it is believed that the window regions 1215 will have a significantly reduced dislocation density by virtue of the initial lateral growth process from sidewalls 1121 of group III metal nitride layer 103 (cf. FIG. 11).

Referring to FIGS. 12H-12I, in yet another specific embodiment, during a bulk crystal growth process, for example, an ammonothermal crystal growth process, bulk group III metal nitride material 1213 grows on isolated growth centers 903 on a patterned seed crystal 925 (FIG. 12H), by first growing laterally over at least one of adhesion layers 107 and 113 (FIG. 12I), which now act as a mask layer, and then coalesces (FIG. 12J). After coalescence, bulk-grown group III metal nitride layer 1214 includes window regions 1215, which have grown vertically with respect to isolated growth centers 903, wing regions 1217, which have grown laterally over at least one of adhesion layers 107 and 113, and coalescence fronts 1219, which form at the boundaries between wings growing from adjacent isolated growth centers 903. Bulk-grown group III metal nitride layer 1214 may have a thickness between about 10 micrometers and about 100 millimeters, or between about 100 micrometers and about 20 millimeters. The process and structure that would result from use of patterned seed crystal 1025 (shown in FIG. 10C) would be similar.

In certain embodiments, one or more additional adhesion layers, diffusion-barrier layers, and/or inert layers are deposited on mesa 903 to form a mask layer that controls where crystal growth occurs on the mesas 903. The mask layer may include one or more of the components of the patterned mask layer 611, such as an adhesion layer 605 (e.g., one or more of Ti, TiN, TiN$_y$, TiSi$_2$, Ta, TaN$_y$, Al, Ge, Al$_x$Ge$_y$, Cu, Si, Cr, V, Ni, W, TiW$_x$, TiW$_x$N$_y$), diffusion-barrier layer 607 (e.g., one or more of TiN, TiN$_y$, TiSi$_2$, W, TiW$_x$, TiN$_y$, WN$_y$, TaN$_y$, TiW$_x$N$_y$, TiW$_x$Si$_z$N$_y$, TiC, TiCN, Pd, Rh, Cr, or the like), and/or inert layer 609 (e.g., one or more of Au, Ag, Pt, Pd, Rh, Ru, Ir, Ni, Cr, V, Ti, or Ta), for example. The one or more mask layers may be deposited on the top surface of mesa 903, promoting crystal growth on one or more of the side walls of mesa 903. In another embodiment, one or more mask layers are deposited on the sidewalls of mesa 903, promoting crystal growth on the top of mesa 903. In certain embodiments, crystal growth produces wing regions 1217, which have grown laterally over at least one of adhesion layers 107 and 113, and coalescence fronts 1219, which form at the boundaries between wings growing from adjacent isolated growth centers 903.

In certain embodiments, bulk crystal growth on a composite group III metal nitride composite substrate is performed by another method other than ammonothermal growth, such as HVPE growth or flux growth.

Referring again to FIGS. 12A, 12D, 12G, and 12J, in certain embodiments, bulk-grown group III metal nitride layer 1212 or 1214 is subjected to one or more processes, such as at least one of sawing, lapping, grinding, polishing, chemical-mechanical polishing, laser ablation, or etching, for example, to use bulk-grown group III metal nitride layer 1212 or 1214 as a seed for further bulk growth or as a substrate for fabrication of a device.

In certain embodiments, the concentration of extended defects, such as threading dislocations and stacking faults, in the bulk-grown group III metal nitride layer 1212 or 1214 may be quantified by defect selective etching. Defect-selective etching may be performed, for example, using a solution comprising one or more of H$_3$PO$_4$, H$_3$PO$_4$ that has been conditioned by prolonged heat treatment to form polyphosphoric acid, and H$_2$SO$_4$, or a molten flux comprising one or more of NaOH and KOH. Defect-selective etching may be performed at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers, then removing the bulk-grown group III metal nitride layer, crystal, or wafer from the etchant solution.

The concentration of threading dislocations in the surface of the window regions 1215 may be similar to that in the underlying growth center 903 or less, by as much as approximately four orders of magnitude. The concentration of threading dislocations in the surface of wing regions 1217 may be lower, by about zero to about three orders of magnitude, than the concentration of threading dislocations in the surface of the window regions 1215, and may be below about $10^5$ cm$^{-2}$, below about $10^4$ cm$^{-2}$, below about $10^3$ cm$^{-2}$, below about $10^2$ cm$^{-1}$, or below about 10 cm$^{-2}$. Some stacking faults, for example, at a concentration between about 1 cm$^{-1}$ and about $10^4$ cm$^{-1}$, may be present at the surface of the window regions 1215. The concentration of stacking faults in the surface of wing regions 1217 may be lower, by about zero to about three orders of magnitude, than the concentration of stacking faults in the surface of the window regions 1215, and may be below about $10^2$ cm$^{-1}$, below about 10 cm$^{-1}$, below about 1 cm$^{-1}$, or below about 0.1 cm$^{-1}$, or may be undetectable. Threading dislocations, for example, edge dislocations, may be present at coalescence fronts 1219, for example, with a line density that is less than about $1\times10^5$ cm$^{-1}$, less than about $3\times10^4$ cm$^{-1}$, less than about $1\times10^4$ cm$^{-1}$, less than about $3\times10^3$ cm$^{-1}$, less than about $1\times10^3$ cm$^{-1}$, less than about $3\times10^2$ cm$^{-1}$, or less than $1\times10^2$ cm$^{-1}$. The density of dislocations along the coalescence fronts may be greater than 5 cm$^{-1}$, greater than 10 cm$^{-1}$, greater than 20 cm$^{-1}$, greater than 50 cm$^{-1}$, greater than 100 cm$^{-1}$, greater than 200 cm$^{-1}$, or greater than 500 cm$^{-1}$.

FIGS. 13A-13C are simplified diagrams illustrating a method of forming a free-standing group III metal nitride boule and free-standing group III metal nitride wafers. In certain embodiments, bulk-grown group III metal nitride layer 1214 is removed from patterned seed crystal 925 by one or more of sawing, grinding, lapping, polishing, laser lift-off, and etching to form a processed free-standing group III metal nitride boule 1313. In some embodiments, the separation or slicing operation is performed substantially parallel to surface 115 in such a way that patterned seed crystal 925 is recovered intact, without cracking, such that it can be re-used as a seed crystal after additional processing, such as one or more of grinding, lapping, polishing, etching, and chemical-mechanical polishing. In some embodiments, the plane of the slicing process is substantially parallel to surface 519 of group III metal nitride layer 103. In an alternate embodiment, a backside grinding or lapping process is performed on the patterned seed crystal 925 elements, after the bulk-grown group III metal nitride layer 1214 is formed, to form the processed free-standing group III metal nitride boule 1313. In this embodiment, the grinding or lapping process removes the patterned seed crystal 925 components, and portion of the bulk-grown group III metal nitride layer 1214, to form the processed free-standing group III metal nitride boule 1313 such that newly produced surface 1223 is approximately parallel to removed surface 115.

Referring to FIG. 13B, a formed free-standing group III metal nitride boule 1313 may include one or more window regions 1315 that were formed above growth centers 903, for example, one or more wing regions 1317 that were formed above laterally-grown regions, for example, and one or more coalescence front regions 1319. One or more of front surface 1321 and back surface 1323 (both of which are parallel to surface 519) of free-standing group III metal nitride boule 1313 may be subjected to additional processing, such as at least one of grinding, lapping, polishing, etching, and chemical-mechanically polishing. Similar processes may be performed on the bulk-grown group III metal nitride layers 1212 or 1214 whose preparation is illustrated schematically in FIGS. 12A, 12B-12D, or 12E-12G, resulting in similar free-standing group III metal nitride boules 1313.

In certain embodiments, one or more edges of free-standing group III metal nitride boule 1313 is ground to form a hexagonal, a rectangular, or a cylindrically-shaped group III metal nitride boule. However, other shapes are also possible. In certain embodiments, one or more flats is ground into the side of free-standing group III metal nitride boule 1313. In certain embodiments, free-standing group III metal nitride boule 1313 is sliced into one or more free-standing laterally-grown group III metal nitride seeds or wafers 1331, as shown schematically in FIG. 13C. The slicing may be performed by multi-wire sawing, multi-wire slurry sawing, slicing, inner-diameter sawing, outer-diameter sawing, cleaving, ion implantation followed by exfoliation, laser cutting, or the like. One or more large-area surfaces of free-standing group III metal nitride seeds or wafers 1331 may be ground, lapped, polished, etched, electrochemically polished, photoelectrochemically polished, reactive-ion-etched, and/or chemical-mechanically polished according to methods that are known in the art. In certain embodiments, a chamfer, bevel, or rounded edge is ground into the edges of free-standing group III metal nitride wafers 1331. The free-standing group III metal nitride seeds or wafers may have a diameter or dimension of at least about 5 millimeters, at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters and may have a thickness between about 50 micrometers and about 10 millimeters or between about 150 micrometers and about 1 millimeter. One or more large-area surface of free-standing group III metal nitride seeds or wafers 1331 may be used as a substrate or seed crystal for group III metal nitride growth by chemical vapor deposition, metalorganic chemical vapor deposition, hydride vapor phase epitaxy, molecular beam epitaxy, flux growth, solution growth, ammonothermal growth, among others, or the like.

FIGS. 14A-14E are simplified diagrams illustrating threading dislocation patterns 1420 formed in a free-standing group III metal nitride boule 1313 or wafer 1331. The large-area surfaces of free-standing group III metal nitride boule 1313 or wafer 1331 may comprise one or more window regions 1415 that were formed above openings 613 in patterned mask layer(s) 611, one or more wing regions 1417 that were formed above non-open regions in patterned mask layer(s) 611, and a pattern 1419 of locally-approximately-linear arrays of threading dislocations that propagated from coalescence fronts 1219 formed during the epitaxial lateral overgrowth process as discussed above in conjunction with FIGS. 12B-12J and 13A-13C. As similarly discussed above, the coalescence front regions 1219 and/or 1319 may include a coalescence front region that includes a "sharp boundary" that has a width less than about 25 micrometers or less than about 10 micrometers that is disposed between the adjacent wing regions 1317, or an "extended boundary" that has a width between about 25 micrometers and about 1000 micrometers or between about 30 micrometers and about 250 micrometers that is disposed between the adjacent wing regions 1317, depending on the growth conditions. The pattern 1419 of locally-approximately-linear arrays of threading dislocations may be 2D hexagonal, square, rectangular, trapezoidal, triangular, 1D linear, or an irregular pattern that is formed at least partially due to the pattern of the exposed regions 120 (FIGS. 7A-7E and 8A-8B). More complex patterns are also possible and may be advantageous, for example, in being more resistant to cracking or cleaving. The pattern may be elongated in one direction compared to another orthogonal direction, for example, due to the boule being sliced at an inclined angle relative to the large-area surface of a free-standing group III metal nitride boule. In some embodiments, one or more through-holes are present in the laterally-grown group III metal nitride boule or wafer at the termination of one or more locally-approximately-linear arrays of threading dislocations. The pattern of locally-approximately-linear arrays of threading dislocations may be characterized by a pitch dimension L, or by pitch dimensions $L_1$ and $L_2$ in two orthogonal directions, between about 5 micrometers and about 20 millimeters or between about 200 micrometers and about 5 millimeters, or between about 500 micrometers and about 2 millimeters. In certain embodiments, the pattern of locally-approximately-linear arrays of threading dislocations is approximately aligned with the underlying crystal structure of the group III metal nitride, for example, with the locally-approximately-linear arrays lying within about 5 degrees, within about 2 degrees, or within about 1 degree of one or more of <1 0 −1 0>, <1 1 −2 0>, or [0 0 0 ±1] or their projections in the plane of the surface of the free-standing laterally-grown group III nitride boule or wafer. The linear concentration of threading dislocations in the pattern may be less than about $1 \times 10^5$ cm$^{-1}$, less than about $3 \times 10^4$ cm$^{-1}$, less than about $1 \times 10^4$ cm$^{-1}$, less than about $3 \times 10^3$ cm$^{-1}$, less than about $1 \times 10^3$ cm$^{-1}$, less than about $3 \times 10^2$ cm$^{-1}$, or less than about $1 \times 10^2$ cm$^{-1}$. The linear concentration of threading dislocations in the pattern may be greater than 5 cm$^{-1}$, greater than 10 cm$^{-1}$, greater than 20 cm$^{-1}$, greater than 50 cm$^{-1}$, greater than 100 cm$^{-1}$, greater than 200 cm$^{-1}$, or greater than 500 cm$^{-1}$.

The concentration of threading dislocations in wing regions 1417 between adjacent locally-approximately-linear arrays of threading dislocations may be below about $10^5$ cm$^{-2}$, below about $10^4$ cm$^{-2}$, below about $10^3$ cm$^{-2}$, below about $10^2$ cm$^{-1}$, or below about 10 cm$^{-2}$. The concentration of threading dislocations, averaged over a large-area surface of the free-standing group III metal nitride boule 1313 or wafer 1331, may be below about $10^7$ cm$^{-2}$, below about $10^6$ cm$^{-2}$, below about $10^5$ cm$^{-2}$, below about $10^4$ cm$^{-2}$, below about $10^3$ cm$^{-2}$, or below about $10^2$ cm$^{-1}$. The concentration of stacking faults, averaged over a large-area surface of the free-standing group III metal nitride boule 1313 or wafer 1331, may be below about $10^3$ cm$^{-1}$, below about $10^2$ cm$^{-1}$, below about 10 cm$^{-1}$, below about 1 cm$^{-1}$, or below about 0.1 cm$^{-1}$, or may be undetectable. In some embodiments, for example, after repeated re-growth on a seed crystal with a patterned array of dislocations and/or growth to a thickness greater than 2 millimeters, greater than 3 millimeters, greater than 5 millimeters, or greater than 10 millimeters, the positions of the threading dislocations may be displaced laterally to some extent with respect to the pattern on the seed crystal. In such a case the regions with a higher concentration of threading dislocations may be somewhat more diffuse than the relatively sharp lines illustrated schematically in FIGS. 14A-14E. However, the concentration of threading dislocations as a function of lateral position along a line on the surface will vary periodically, with a period between about 5 micrometers and about 20 millimeters or between about 200 micrometers and about 5 millimeters, or between about 500 micrometers and about 2 millimeters. The concentration of threading dislocations within the periodically-varying region may vary by at least a factor of two, at least a factor of 5, at least a factor of 10, at least a factor of 30, at least a factor of 100, at least a factor of 300, or at least a factor of 1000.

Referring again to FIGS. 14A-14E, window regions 1415 may be positioned between adjacent wing regions 1417 (FIG. 14D) or within a single wing region 1417 (FIGS. 14A-14C, and 14E). The window regions 1415 are formed over the exposed regions 720 formed within the patterned mask layer(s) 611, as generally discussed above in conjunction with FIGS. 7A-7E and 8A-8B. The concentration of threading dislocations in the surface of wing regions 1417 may be lower, by about zero to about three orders of magnitude, than the concentration of threading dislocations in the surface of the window regions 1415, and may be below about $10^3$ cm$^{-2}$, below about $10^2$ cm$^{-1}$, or below about 10 cm$^{-2}$. Some stacking faults, for example, at a concentration between about 1 cm$^{-1}$ and about $10^4$ cm$^{-1}$, may be present at the surface of the window regions 1415. The concentration of stacking faults in the surface of wing regions 1417 may be lower, by about zero to about three orders of magnitude, than the concentration of stacking faults in the surface of the window regions 1415, and may be below about $10^2$ cm$^{-1}$, below about 10 cm$^{-1}$, below about 1 cm$^{-1}$, or below about 0.1 cm$^{-1}$, or may be undetectable. Threading dislocations, for example, edge dislocations, may be present at coalescence front regions 1419, for example, with a line density that is less than about $1\times10^5$ cm$^{-1}$, less than about $3\times10^4$ cm$^{-1}$, less than about $1\times10^4$ cm$^{-1}$, less than about $3\times10^3$ cm$^{-1}$, less than about $1\times10^3$ cm$^{-1}$, less than about $3\times10^2$ cm$^{-1}$, or less than $1\times10^2$ cm$^{-1}$. The density of dislocations along the coalescence fronts may be greater than 5 cm$^{-1}$, greater than 10 cm$^{-1}$, greater than 20 cm$^{-1}$, greater than 50 cm$^{-1}$, greater than 100 cm$^{-1}$, greater than 200 cm$^{-1}$, or greater than 500 cm$^{-1}$.

Surfaces 1321, 1323, and 1333 of free-standing group III metal nitride boule 1313 or wafer 1331 may have a large-area crystallographic orientation within 5 degrees, within 2 degrees, within 1 degree, within 0.5 degree, within 0.2 degree, within 0.1 degree, within 0.05 degree, within 0.02 degree, or within 0.01 degree of (0001)+c-plane, (000-1)-c-plane, {10-10} m-plane, {1 1 -2 0} a-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 -1 ±2}, {1 0 -1 ±3}, {2 1 -3 ±1}, or {3 0 -3 ±4}. The free-standing group III metal nitride boule 1313 or wafer 1331 may have an (h k i l) semipolar large-area surface orientation, where i=−(h+k) and l and at least one of h and k are nonzero.

Surfaces 1321, 1323, and 1333 of free-standing group III metal nitride boule 1313 or wafer 1331 may be characterized by a value of M/D that is less than 0.003 degree/mm, less than 0.002 degree/mm, less than 0.001 degree/mm, less than 0.0005 degree/mm, less than 0.0002 degree/mm, or less than 0.0001 degree/mm, where M is the miscut variation, in degrees, across the surface and D is the maximum dimension or diameter of the surface, in millimeters. The miscut variation M is defined as the difference in miscut, with respect to a nominal crystallographic orientation, between the maximum value of the miscut and the minimum value of the miscut across the surface.

In certain embodiments, at least one of surfaces 1321, 1323, and 1333 of free-standing group III metal nitride boule 1313 or wafer 1331 has a crystallographic orientation that is miscut from {10-10} m-plane by between about −60 degrees and about +60 degrees toward [0001]+c-direction and by up to about 10 degrees toward an orthogonal <1-210> a-direction. In certain embodiments, at least one of surfaces 1321, 1323, and 1333 has a crystallographic orientation that is miscut from {10-10} m-plane by between about −30 degrees and about +30 degrees toward [0001]+c-direction and by up to about 5 degrees toward an orthogonal <1-210> a-direction. In certain embodiments, at least one of surfaces 1321, 1323, and 1333 has a crystallographic orientation that is miscut from {10-10} m-plane by between about −5 degrees and about +5 degrees toward +c-direction and by up to about 1 degree toward an orthogonal <1-210> a-direction. The free-standing group III metal nitride boule 1313 or wafer 1331 may have a stacking fault concentration below $10^2$ cm$^{-1}$, below 10 cm$^{-1}$, or below 1 cm$^{-1}$, and a very low dislocation density, below about $10^5$ cm$^{-2}$, below about $10^4$ cm$^{-2}$, below about $10^3$ cm$^{-2}$, below about $10^2$ cm$^{-2}$, or below about 10 cm$^{-2}$ on one or both of its two large-area surfaces.

The free-standing group III metal nitride boule 1313 or wafer 1331 may have a symmetric x-ray rocking curve full width at half maximum (FWHM) less than about 200 arcsec, less than about 100 arcsec, less than about 50 arcsec, less than about 35 arcsec, less than about 25 arcsec, or less than about 15 arcsec. The free-standing laterally-grown group III metal nitride boule or wafer may have a crystallographic radius of curvature greater than 0.1 meter, greater than 1 meter, greater than 10 meters, greater than 100 meters, or greater than 1000 meters, in at least one, at least two, or in three independent or orthogonal directions.

The free-standing group III metal nitride boule 1313 or wafer 1331 may be characterized by a wurtzite structure substantially free from any cubic entities or other crystal structures, the other structures being less than about 0.1% in volume in reference to the substantially wurtzite structure.

A free-standing group III metal nitride wafer 1331 may be characterized by a total thickness variation (TTV) of less than about 25 micrometers, less than about 10 micrometers, less than about 5 micrometers, less than about 2 micrometers, or less than about 1 micrometer, and by a macroscopic bow that is less than about 200 micrometers, less than about 100 micrometers, less than about 50 micrometers, less than about 25 micrometers, or less than about 10 micrometers. Surface 1333 of free-standing group III metal nitride wafer 1331 may have a concentration of macro defects, with a diameter or characteristic dimension greater than about 100 micrometers, of less than about 2 cm$^{-2}$, less than about 1 cm$^{-2}$, less than about 0.5 cm$^{-2}$, less than about 0.25 cm$^{-2}$, or less than about 0.1 cm$^{-2}$. The variation in miscut angle across a large-area surface of the free-standing laterally-grown group III metal nitride wafer may be less than about 5 degrees, less than about 2 degrees, less than about 1 degree, less than about 0.5 degree, less than about 0.2 degree, less than about 0.1 degree, less than about 0.05 degree, or less than about 0.025 degree in each of two orthogonal crystallographic directions. The root-mean-square surface roughness of a large-area surface of the free-standing laterally-grown group III metal nitride wafer, as measured over an area of at least 10 μm×10 μm, may be less than about 0.5 nanometer, less than about 0.2 nanometer, less than about 0.15 nanometer, less than about 0.1 nanometer, or less than about 0.10 nanometer. The free-standing group III metal nitride wafer 1331 may be characterized by n-type electrical conductivity, with a carrier concentration between about $1\times10^{17}$ cm$^{-3}$ and about $3\times10^{19}$ cm$^{-3}$ and a carrier mobility greater than about 100 cm$^2$/V-s. In alternative embodiments, the free-standing group III metal nitride wafer 1331 is characterized by p-type electrical conductivity, with a carrier concentration between about $1\times10^{15}$ cm$^{-3}$ and about $1\times10^{19}$ cm$^{-3}$. In still other embodiments, the free-standing group III metal nitride wafer 1331 is characterized by semi-insulating electrical behavior, with a room-temperature resistivity greater than about 107 ohm-centimeter, greater than about $10^8$ ohm-centimeter, greater than about 109 ohm-centimeter, greater than about $10^{10}$ ohm-centimeter, or greater than about $10^{11}$ ohm-centimeter. In certain embodiments, the free-standing group III metal nitride wafer 1331 is highly transparent, with an optical absorption coefficient at a wavelength of 400 nanometers that is less than about 10 cm$^{-1}$, less than about 5 cm$^{-1}$, less than about 2 cm$^{-1}$, less than about 1 cm$^{-1}$, less than about 0.5 cm$^{-1}$, less than about 0.2 cm$^{-1}$, or less than about 0.1 cm$^{-1}$.

In some embodiments, the free-standing group III metal nitride boule 1313 or wafer 1331 is used as a seed crystal for further bulk growth. In one specific embodiment, the further bulk growth consists of or includes ammonothermal bulk crystal growth. In another specific embodiment, the further bulk growth consists of or includes high temperature solution crystal growth, also known as flux crystal growth. In yet another specific embodiment, the further bulk growth consists of or includes HVPE. The further-grown crystal may be sliced, sawed, lapped, polished, etched, ground, and/or chemically-mechanically polished into wafers by methods that are known in the art. The surface of the wafers may be characterized by a root-mean-square surface roughness measured over a 10-micrometer by 10-micrometer area that is less than about 1 nanometer or less than about 0.2 nanometers.

A free-standing group III metal nitride wafer 1331 formed by the one or more processes described above may be incorporated into a semiconductor structure. The semiconductor structure may consist of or include at least one Al$_x$In$_y$Ga$_{(1-x-y)}$N epitaxial layer, where 0≤x, y, x+y≤1. The epitaxial layer may be deposited on the wafer, for example, by metalorganic chemical vapor deposition (MOCVD) or by molecular beam epitaxy (MBE), according to methods that are known in the art. At least a portion of the semiconductor structure may form a portion of a gallium-nitride-based electronic device or optoelectronic device, such as a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and combinations thereof. The gallium-nitride-based electronic device or optoelectronic device may be incorporated into a lamp or a fixture, such as a luminaire. The gallium-nitride-based electronic device or optoelectronic device, after singulation, may have lateral dimensions of at least 0.1 millimeter by 0.1 millimeter. The gallium-nitride-based electronic or optoelectronic device may have a maximum dimension of at least 8 millimeters and, for example, may consist of or include a laser diode. The gallium-nitride-based electronic or optoelectronic device may be entirely free of dislocations throughout its volume. For example, at a dislocation density of 10$^4$ cm$^{-2}$, a substantial fraction of 0.1×0.1 mm$^2$ devices could be expected to be free of dislocations. At a dislocation density of 10$^2$ cm$^{-2}$, a substantial fraction of 1×1 mm$^2$ devices could be expected to be free of dislocations. The gallium-nitride-based electronic or optoelectronic device may be entirely free of stacking faults throughout its volume. For example, at a stacking fault density of 1 cm$^{-1}$, a substantial fraction of 10×1 mm$^2$ stripe-shaped devices, such as laser diodes with nonpolar or semipolar large-area surfaces and c-plane facets, could be expected to be free of stacking faults.

METHOD EXAMPLE(S)

The methods described herein provide means for fabricating high-performance light emitting diodes, laser diodes, and/or electronic devices that avoid potential issues associated with defective regions in the large-area group III metal nitride boules or wafers.

A commercial GaN-on-sapphire template is provided, with a (0001)-oriented GaN layer having a thickness of 10 micrometers (e.g., group III metal nitride layer 103), a sapphire thickness of 600 micrometers (e.g., template substrate 101), and a diameter of 150 millimeters. The template is placed in a sputter-deposition chamber and a 100-nanometer-thick layer of TiW is deposited as an adhesion layer, followed by a 780-nanometer-thick protective layer comprising Au, followed by a second 100-nanometer-thick layer of TiW. The template is then placed on a deposition surface in a polycrystalline-GaN reactor and the reactor is evacuated and back-filled with nitrogen. The temperature of the deposition surface in the reactor is then raised to 900° C. and a bake-out in a mixture of 5% H$_2$ in N$_2$ is performed for 24 hours to remove oxygen and moisture from the furnace. After the nitrogen bake-out, 1.2 standard liters per minute of Cl$_2$ is flowed through a source chamber containing gallium at a temperature of 850 degrees Celsius and the effluent is mixed with a flow of 15 standard liters per minute of NH$_3$ in a nitrogen carrier gas. The process is run for 30 hours, the reactive gases are stopped, and the reactor is cooled. A textured, polycrystalline GaN layer, approximately 1 millimeter thick, is deposited on the template, producing a structure similar to that shown schematically in FIG. 4. The mismatch in thermal expansion coefficient between the polycrystalline GaN layer and the sapphire substrate causes formation of a number of cracks in the sapphire.

The template coated with the polycrystalline GaN layer is placed on a graphite susceptor with the sapphire substrate exposed, placed in a graphite crucible, covered with KBF$_4$ powder, and placed in a furnace. Under flowing nitrogen, the graphite susceptor is heated to 600 degrees Celsius, held at this temperature for 36 hours, pulled out from the molten KBF$_4$, and cooled. The sapphire has been etched away, producing a structure (e.g., composite substrate 501) similar to that shown schematically in FIG. 5. Some of the cracks from the sapphire propagate into the GaN layer but it is otherwise intact. The recovered template, including a single-crystal GaN layer bonded to a polycrystalline GaN layer, is placed in a sputter-deposition chamber with the N-face exposed. A 100-nanometer-thick layer of TiW is sputter-deposited as an adhesion layer, followed by a 780-nanometer-thick inert layer comprising Au. A 6-micrometer-thick Au layer is then electroplated on the sputtered layer, increasing the thickness of the inert layer. Using AZ-4300 as a photoresist, a pattern comprising linear arrays of 3-micrometer-wide by 1-centimeter-long slits, with a pitch diameter of 800 micrometers is defined. A wet-etch process is performed, using a commercial TFA gold etching solution at room temperature. The mask pattern includes domains of m-stripes, with linear openings oriented approximately 30-40 micrometers wide and parallel to <10-10>. The patterned substrate is then placed in a stirred beaker with concentrated H$_3$PO$_4$. The beaker is heated to approximately 280 degrees Celsius over approximately 30 minutes, held at this temperature for approximately 10 minutes, and cooled, resulting in a structure similar to that shown schematically in FIG. 11.

The patterned substrate is placed in a silver capsule with an inner diameter of 230 millimeters along with a 15%-open-area baffle, polycrystalline GaN nutrient, NH$_4$F mineralizer, and ammonia, and the capsule is sealed. The ratios of GaN nutrient and NH$_4$F mineralizer to ammonia are approximately 1.69 and 0.099, respectively, by weight. The capsule is placed in an internally-heated high pressure apparatus and heated to temperatures of approximately 666 degrees Celsius for the upper, nutrient zone and approximately 681 degrees Celsius for the lower, crystal growth zone, maintained at these temperatures for approximately 215 hours, and then cooled and removed. Ammonothermal GaN grows laterally and fills in most of the volume in the trenches, grows vertically through the linear openings in the patterned mask on the patterned substrate, grows laterally, and coalesces fully, forming an ammonothermal GaN layer approximately 1200 micrometers thick with a smooth top surface, similar to the structure shown schematically in FIG. 12C. The multiple-lateral-growth process causes healing of the cracks that were present in the GaN layer after dissolution of the sapphire, so that the ammonothermal GaN layer is substantially crack-free.

Although the above is a full description of specific embodiments, various modifications, alternative constructions and equivalents may be used. Therefore, the above description and illustrations should not be taken as limiting the scope of the present disclosure which is defined by the appended claims.

What is claimed:

1. A method for forming a free-standing group III metal nitride crystal, the method comprising:
   forming a handle substrate overlying a template, wherein
      the template comprises a template substrate and a group III metal nitride layer disposed overlying a surface of the template substrate,
      the template substrate has a first surface on which the group III metal nitride layer is disposed, and the template substrate comprises one of sapphire, silicon carbide, silicon, gallium arsenide, germanium, a silicon-germanium alloy, MgAl$_2$O$_4$ spinel, ZnO, ZrB$_2$, BP, InP, AlON, ScAlMgO$_4$, YFeZnO$_4$, MgO, Fe$_2$NiO$_4$, LiGa$_5$O$_8$, Na$_2$MoO$_4$, Na$_2$WO$_4$, In$_2$CdO$_4$, lithium aluminate (LiAlO$_2$), LiGaO$_2$, Ca$_8$La$_2$(PO$_4$)$_6$O$_2$, gallium nitride (GaN), or aluminum nitride (AlN),
      the handle substrate comprises a polycrystalline group III metal nitride material having substantially the same composition as the group III metal nitride layer and is formed by depositing the polycrystalline group III metal nitride material over the group III metal nitride layer, and
   removing the template substrate to form a group III metal nitride composite substrate, wherein the group III metal nitride composite substrate has an exposed surface that comprises at least a portion of the group III metal nitride layer.

2. The method of claim 1, further comprising depositing a protective layer on the group III metal nitride layer prior to forming the handle substrate by a deposition process on the template.

3. The method of claim 1, further comprising:
   performing a bulk crystal growth process on the group III metal nitride composite substrate to form a bulk-grown group III metal nitride layer; and
   separating the bulk-grown group III metal nitride layer from the handle substrate to form a free-standing group III metal nitride boule, wherein the free-standing group III metal nitride boule has a first surface and a second surface, and the second surface is formed during the process of separating the bulk-grown group III metal nitride layer from the handle substrate.

4. The method of claim 3, wherein the bulk crystal growth process comprises an ammonothermal growth process.

5. The method of claim 3, wherein the second surface is characterized by a crystallographic orientation within 5 degrees of (0 0 0 ±1) c-plane.

6. The method of claim 3, wherein the second surface is characterized by a crystallographic orientation within 5 degrees of {10-10} m-plane or of a semipolar orientation selected from {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 −1 ±2}, {1 0 −1 ±3}, {2 1 −3 ±1}, and {3 0 −3 ±4}.

7. The method of claim 1, wherein
   the exposed surface comprises a pattern of isolated growth center regions that each comprise at least a portion of the group III metal nitride layer, and the pattern of isolated growth center regions comprises growth centers having a minimum dimension between 1 micrometer and 100 micrometers, and being characterized by at least one pitch dimension between 5 micrometers and 5 millimeters, and
   the method further comprises:
      growing a group III metal nitride crystalline material from the pattern of isolated growth center regions vertically and laterally to form a bulk-grown group III metal nitride layer having an exposed bulk-grown surface, wherein portions of the group III metal nitride crystalline material grown between two or more adjacent growth centers coalesce.

8. The method of claim 7, further comprising:
   separating the bulk-grown group III metal nitride layer from the handle substrate to form a free-standing group III metal nitride boule having a second surface, wherein the second surface is formed during the process of separating the bulk-grown group III metal nitride layer from the handle substrate.

9. The method of claim 8, wherein the exposed bulk-grown surface is characterized by locally-approximately linear arrays of threading dislocations, the threading dislocations within the locally-approximately linear arrays having a concentration between about 5 cm$^{-1}$ and about 10$^5$ cm$^{-1}$.

10. The method of claim 9, wherein the exposed bulk-grown surface is further characterized by an array of wing regions, each wing region being positioned between adjacent locally-approximately linear arrays of threading dislocations and having a minimum lateral dimension between 2 micrometers and 100 micrometers and being characterized by a concentration of threading dislocations between about 10$^3$ cm$^{-2}$ and about 10$^8$ cm$^{-2}$.

11. The method of claim 10, wherein the exposed bulk-grown surface further comprises one or more window regions disposed between adjacent pairs of wing regions or within a single wing region, wherein the one or more window regions have an average concentration of threading dislocations between about 10$^5$ cm$^{-2}$ and about 10$^9$ cm$^{-2}$ and a concentration of stacking faults below 10$^3$ cm$^{-1}$.

12. The method of claim 9, wherein the locally-approximately linear arrays of threading dislocations are oriented within about 5 degrees of a crystallographic plane selected from <1 0 –1 0>, <1 1 –2 0>, and [0 0 0 ±1], and a projection of the crystallographic plane on the exposed bulk-grown surface.

13. The method of claim 9, wherein the exposed bulk-grown surface is characterized by a symmetric x-ray diffraction rocking-curve full width at half maximum value less than about 100 arcsec, an overall dislocation density below about $10^8$ cm$^{-2}$ and the overall dislocation density within the isolated growth center regions between the locally-approximately linear arrays of threading dislocations is below about $10^6$ cm$^{-2}$.

14. The method of claim 13, wherein a stacking fault concentration on the second surface is below about 1 cm$^{-1}$.

15. The method of claim 7, wherein the growth centers have a minimum dimension between 5 micrometers and 50 micrometers and the pattern of isolated growth center regions is characterized by at least one pitch dimension between 500 micrometers and 2 millimeters.

16. The method of claim 7, further comprising exposing sidewalls of said group III metal nitride layer by an etching or laser ablation process.

17. The method of claim 7, wherein the pattern of isolated growth center regions are selected from a two-dimensional hexagonal, a square, a rectangular, a trapezoidal, a triangular, and a one-dimensional linear pattern of growth centers.

18. The method of claim 1, wherein the template substrate comprises one of sapphire, silicon carbide, and silicon.

19. A method for forming a free-standing group III metal nitride crystal, comprising:
    forming a handle substrate overlying a template, wherein
        the template comprises a template substrate and a group III metal nitride layer, wherein the group III metal nitride layer is disposed overlying a first surface of the template substrate, and
        the handle substrate comprises a polycrystalline group III metal nitride material having substantially the same composition as the group III metal nitride layer and is formed by depositing the polycrystalline group III metal nitride material over the group III metal nitride layer;
    removing the template substrate to form a group III metal nitride composite substrate, wherein the group III metal nitride composite substrate has an exposed surface that comprises a pattern of isolated growth center regions that each comprise at least a portion of the group III metal nitride layer; and
    growing a group III metal nitride crystalline material from the pattern of isolated growth center regions vertically and laterally to form a bulk-grown group III metal nitride layer, wherein portions of the group III metal nitride crystalline material grown between two or more adjacent growth centers coalesce.

20. The method of claim 19, wherein the bulk-grown group III metal nitride layer has an exposed growth surface, and the method further comprises:
    separating the bulk-grown group III metal nitride layer from the handle substrate to form a free-standing group III metal nitride boule having a second surface that is opposite to the exposed growth surface.

21. The method of claim 20, wherein separating the bulk-grown group III metal nitride layer from the handle substrate comprises slicing the bulk-grown group III metal nitride layer in a direction parallel to the exposed growth surface.

22. The method of claim 21, wherein separating the bulk-grown group III metal nitride layer from the handle substrate comprises either grinding or lapping the group III metal nitride composite substrate to remove the handle substrate from the group III metal nitride composite substrate.

* * * * *